United States Patent [19]
Schlueter et al.

[11] Patent Number: 6,015,476
[45] Date of Patent: Jan. 18, 2000

[54] PLASMA REACTOR MAGNET WITH INDEPENDENTLY CONTROLLABLE PARALLEL AXIAL CURRENT-CARRYING ELEMENTS

[75] Inventors: Ross D. Schlueter, Berkeley; Steve Marks, Moraga, both of Calif.

[73] Assignee: Applied Materials, Inc., Santa Clara, Calif.

[21] Appl. No.: 09/019,522

[22] Filed: Feb. 5, 1998

[51] Int. Cl.[7] .................................................. C23F 1/02
[52] U.S. Cl. ................ 156/345; 118/723 E; 118/723 ER; 118/723 I; 118/723 IR; 204/298.37
[58] Field of Search .................... 156/345; 118/723 E, 118/723 ER, 723 I, 723 IR; 204/298.37

[56] References Cited

U.S. PATENT DOCUMENTS

| | | | |
|---|---|---|---|
| 4,668,365 | 5/1987 | Foster et al. | 204/192.23 |
| 4,842,683 | 6/1989 | Cheng et al. | 156/345 |
| 5,225,024 | 7/1993 | Hanley et al. | 156/345 |
| 5,614,055 | 3/1997 | Fairbairn et al. | 156/345 |
| 5,718,795 | 2/1998 | Plavidal et al. | 156/345 |
| 5,753,044 | 5/1998 | Hanawa et al. | 118/723 I |
| 5,900,064 | 5/1999 | Kholodenko | 118/723 R |

*Primary Examiner*—William Krynski
*Assistant Examiner*—B. Shewareged
*Attorney, Agent, or Firm*—Michaelson and Wallace

[57] ABSTRACT

The invention is embodied in a magnetically enhanced plasma reactor for processing a semiconductor workpiece, including a reactor enclosure defining a vacuum chamber, a wafer support for holding the workpiece inside the chamber, a plasma power source for applying plasma source power into the chamber, a first plurality of electrically conductive elongate filaments, each being of a finite length, distributed about a periphery of the chamber enclosure, each of said filaments extending at least generally in an axial direction relative to the chamber. The plurality of filaments is capable of permitting different currents through different ones of at least some of the filaments in accordance with a distribution of currents among the filaments corresponding to a desired magnetic field configuration. Respective current sources are preferably connected to deliver respective currents to different ones of the plurality of filaments. Preferably, the respective current sources apply different currents to different ones of the filaments in accordance with the distribution of currents among the filaments corresponding to the desired magnetic field configuration Preferably, the filaments are generally mutually parallel. Preferably, the currents flowing through adjacent ones of the plural filaments are in the same direction.

83 Claims, 13 Drawing Sheets

PLASMA REACTOR MAGNET WITH INDEPENDENTLY CONTROLLABLE PARALLEL AXIAL CURRENT-CARRYING ELEMENTS

BACKGROUND OF THE INVENTION

1. Technical Field

The present invention relates to semiconductor processing plasma reactor magnets for use in semiconductor fabrication process chambers employing magnetically-enhanced plasmas. More particularly, the invention relates to magnets for such chambers having a precisely adjustable magnetic field which enhances the instantaneous uniformity of ion bombardment of a semiconductor workpiece with either a nearly perfectly uniform magnetic field across the workpiece or a magnetic field with a nearly perfectly uniform gradient across the workpiece or another precisely adjustable desired magnetic field distribution.

2. Background Art

Plasma etch chambers are widely used to provide suitable etching environments for production of wafers for use in integrated circuits. Semiconductor fabrication process chambers commonly employ plasmas to enhance the performance of various processes for fabricating semiconductor devices on silicon wafers or other workpieces. Such processes include sputter etching, plasma-enhanced chemical etching, plasma enhanced chemical vapor deposition, and ionized sputter deposition. The high energy level of reagents in the plasma generally increases the rate of the fabrication process, and often reduces the temperature at which the semiconductor workpiece must be maintained to perform the process.

As integrated circuits geometries shrink, plasma etch processes must enable higher resolution patterns. Presently, the most widely used dry etch technique, reactive ion etching (RIE), offers directionality and selectivity together with high throughput. Magnetic enhanced reactive ion etching (MERIE) offers increased manipulation of the plasma for enhanced wafer etch control.

In a typical MERIE reactor, four coils, each having numerous turns, formed in loops having the rough shape of a bay windowframe, are positioned azimuthally around the plasma etch chamber. Coils are positioned such that the wafer plane is centered at the vertical midplane of the four-coil system. The coils are energized independently, in time-dependent waveforms; energization of the four coils is synchronized chronized for optimal plasma etch chamber magnetic field distribution and temporal rotation. The desired magnetic field distribution at and near the wafer plane is partially provided by the vertically oriented portions of the coil loops, which cause location-dependent (r,θ) field components in both x- and y-horizontal directions, but none in the z-vertical (axial) direction. The curved horizontal portions of the coil loops, necessary to complete electrical circuits, individually provide additional field components in all three coordinate directions. Undesired field z-components from upper and lower loop segments cancel at magnet's vertical midplane, where the wafer is optimally positioned, leaving a generally radially-directed field component remaining at the wafer plane.

Magnetically-enhanced plasma chambers employ magnetic fields to increase the density of charged particles in the plasma, thereby further increasing the rate of the plasma-enhanced fabrication process. Increasing the process rate is highly advantageous because the cost of fabricating semiconductor devices is directly proportional to the time required for fabrication.

Despite this advantage, many plasma chambers in commercial use do not employ magnetic enhancement, because magnetic enhancement has been found to increase the likelihood of damaging the semiconductor devices on the wafer. (See Fang McVittie, "Charging damage to gate oxides in an $O_2$ magnetron plasma", *J. Appl. Phys.*, vol. 72, no. 10, pp. 4865–4872, Nov. 15, 1992; and Fang McVittie, "The role of 'antenna' structure on thin oxide damage from plasma induced wafer charging", *Mat. Res. Soc. Symp. Proc.*, vol. 265, pp. 231–236, 1992.) Therefore, a need exists for a magnetically-enhanced plasma chamber that affords the benefits of conventional magnetic enhancement but with a reduced risk of semiconductor device damage.

It is believed that a major cause of semiconductor device damage in conventional magnetically-enhanced plasma chambers may be that the uniform magnetic field conventionally considered ideal by some workers actually causes an E×B drift of electrons in the plasma pre-sheath, which in turn causes the ion flux bombarding the semiconductor wafer or workpiece to have a highly non-uniform distribution across the surface area of the workpiece.

The reasons for instantaneous non-uniformity of ion flux in conventional magnetically-enhanced plasma chambers will be explained. FIG. 1A shows a magnetically-enhanced plasma chamber suitable for either etching or chemical vapor deposition (CVD). The vacuum chamber is enclosed by cylindrical side wall 12, circular bottom wall 14, and circular top wall or lid 16. The lid 16 and bottom wall 14 may be either dielectric or metal. An electrically grounded anode electrode 18 is mounted at the bottom of the lid 16. The anode electrode may be perforated to function as a gas inlet through which process gases enter the chamber. The side wall 12 may be either dielectric or metal. If it is metal, the metal must be a non-magnetic material such as anodized aluminum so as to not interfere with the magnetic field created by electromagnet coils outside the chamber. If the side wall is metal, it will function as part of the anode.

The semiconductor wafer or workpiece 20 is mounted on a cathode electrode 22, which, in turn, is mounted in the lower end of the chamber. A vacuum pump, not shown, exhausts gases from the chamber through exhaust manifold 23 and maintains the total gas pressure in the chamber at a level low enough to facilitate creation of a plasma, typically in the range of 10 millitorr to 20 torr, with pressures at the lower and higher ends of the range being typical for etching and CVD processes, respectively.

An RF power supply 24 is connected to the cathode electrode 22 through a series coupling capacitor 26. The RF power supply provides an RF voltage between the cathode electrode and the grounded anode electrode 18 which excites the gases within the chamber into a plasma state. The plasma body has a time-average positive DC potential or voltage relative to the cathode or anode electrodes which accelerates ionized process gas constituents to bombard the cathode and anode electrodes.

Magnetic enhancement of the plasma most commonly is implemented by a DC magnetic field in the region between the cathode and anode electrodes. The direction of the magnetic field is transverse to the longitudinal axis of the chamber, i.e., transverse to the axis extending between the cathode and anode electrodes. Various arrangements of permanent magnets or electromagnets are conventionally used to provide such a transverse magnetic field. One such arrangement is the pair of coils 30 shown in FIG. 1A, disposed on opposite sides of the cylindrical chamber side wall 12. The two coils 30 are connected in series and in phase to a DC power supply, not shown, so that they produce transverse magnetic fields which are additive in the region between the two coils. This transverse magnetic field is represented in FIGS. 1A and 1B by the vector B oriented along the negative x-axis. In the preferred embodiment, the diameter of each coil approximately equals the spacing between the two coils. (The second pair of coils 32 shown in FIG. 1B will be discussed later, but may be ignored for purposes of the present discussion.) An example of such a magnetically enhanced plasma etch chamber is described in commonly assigned U.S. Pat. No. 5,215,619 issued Jun. 1, 1993 to Cheng et al., the disclosure of which is hereby incorporated into the present patent specification.

Because the plasma body has a positive time-average potential or voltage relative to the cathode electrode 22, the time-average electric field E in the plasma pre-sheath adjacent the cathode will be directed downward from the plasma toward the cathode, thereby giving the free electrons in the pre-sheath a drift velocity vector v whose time-averaged value is oriented upward toward the plasma body, as represented by the vector $v_e$ in FIG. 1A. In response to the DC magnetic field vector B, these free electrons of charge e and velocity v additionally experience an ev×B force—commonly called an E×B drift—whose time-averaged value is approximately coplanar with the semiconductor wafer 20 and orthogonal to the magnetic field vector B, as illustrated in FIG. 1B by the E×B vector oriented along the y-axis. In this context, the term "time average" means averaged over one period of the RF frequency or frequencies at which the plasma is excited, this period typically being less than $10^{-7}$ second. This time average over one RF period is unrelated to the time averaging due to optional rotation of the workpiece relative to the magnetic field, which typically has a rotation period on the order of 0.1 to 2 seconds.

This E×B drift of free electrons is believed to be a major source of semiconductor device damage in conventional magnetically-enhanced plasma chambers. Specifically, it is believed that the E×B drift unevenly distributes the free electrons in the plasma pre-sheath, so that the electron concentration progresses from minimum to maximum from the negative y-axis to the positive y-axis. In other words, the electron concentration in the pre-sheath is lowest near the 6 o'clock (270° azimuth) position of the wafer 20, and is highest near the 12 o'clock (90° azimuth) position of the wafer. A high electron concentration produces a high ion concentration, hence the flux of ions bombarding the wafer is lowest and highest at the 6 o'clock and 12 o'clock positions of the wafer, respectively. It is believed this spatial non-uniformity of ion flux bombarding the wafer produces electrical currents in the wafer which often damage the semiconductor devices on the wafer.

Although the present invention does not depend on this theory, it is believed the mechanism of damage due to ion flux instantaneous spatial non-uniformity is as follows. An ion flux spatial non uniformity causes spatially non-uniform accumulation of electrical charge on the wafer. The differential in electrical charge produces voltages and current flow between different points on the wafer. If the voltage across any of the dielectric structures fabricated on the wafer exceeds the maximum safe voltage of that dielectric structure, then a current will flow through the structure which is likely to damage the dielectric structure and therefore damage one or more semiconductor devices on the wafer. We believe a more uniform spatial distribution of instantaneous ion flux bombarding the wafer would reduce the likelihood of such damage.

Conventional magnetically-enhanced plasma chambers attempt to ameliorate this non uniformity by slowly rotating the magnetic field relative to the wafer, typically at a rotation frequency in the range of one-half to five rotations per second. In some designs, the wafer 20 or the magnet 30 is physically rotated. In other designs, as illustrated in FIG. 1B, the rotation is performed electronically by providing a second pair of coils 32 orthogonal to the first pair of coils 30. The magnetic field can be rotated in 90° increments by successively and periodically connecting the DC power supply: (1) to the first coil pair 30 with positive polarity; (2) to the second coil pair 32 with positive polarity; (3) to the first coil pair 30 with negative polarity; and (4) to the second coil pair 32 with negative polarity. Alternatively, the magnetic field can be rotated continuously by replacing the DC power supply with a very low frequency (in the range of 0.1 to 10 Hz) power supply having quadrature outputs connected to provide current to the first coil pair 30 offset in phase by 90° from the current provided to the second coil pair 32.

Rotating the magnetic field relative to the wafer greatly reduces time-average spatial non uniformity in the ion flux bombarding the wafer, and therefore can provide acceptable spatial uniformity of etch rate (in an etching chamber) or deposition rate (in a CVD chamber) on the wafer surface. However ever, rotating the magnetic field does not in any way improve the instantaneous spatial uniformity of ion flux on the wafer surface, and therefore does not solve the problem of semi-conductor device damage in magnetically-enhanced plasma chambers. Consequently, magnetic enhancement heretofore has been used only in a small fraction of commercial plasma chambers for semiconductor fabrication.

One approach to improving the instantaneous spatial uniformity of ion flux on the wafer surface is to provide a magnet netic field which is weakest in the region of the plasma pre-sheath to which electrons will be swept by the E×B drift, and which is strongest in the region from which electrons will be swept by the E×B drift. Stated more mathematically, the approach is to provide a magnetic field whose magnitude at points in the plane of the wafer is characterized by a gradient vector pointing in the opposite direction of—i.e., oriented approximately 180° from—the projection of the E×B vector in the plane of the wafer. Heretofore, it has not been possible or practical to provide a magnetic field having this exact orientation or distribution over the entire surface of the wafer, so that the efficacy of this approach has necessarily been limited. However, some advantage is realized if only the magnetic field has at least approximately this orientation or distribution over a majority of the surface of the wafer.

Regions of the plasma having a higher magnetic field magnitude will have a higher density of free electrons. By providing the strongest magnetic field magnitude in the region of the plasma pre-sheath where the E×B drift will tend to deplete the electron concentration, and by providing the weakest magnetic field where the E×B drift will tend to augment the electron concentration, the foregoing approach tends to equalize (to a limited degree) the electron concentration throughout the pre-sheath adjacent the wafer. A more spatially uniform electron concentration in the pre-sheath sheath produces a more spatially uniform flux of ions bombarding the wafer. The foregoing approach improves the instantaneous spatial uniformity of ions bombarding the wafer, and thereby reduces the risk of damage to semiconductor devices on the wafer.

FIG. 2A illustrates one embodiment of the foregoing approach as described in co-pending U.S. application Serial No. filed by entitled "Magnetically-Enhanced Plasma Chamber with Non-Uniform Magnetic Field". In FIG. 2A, two adjacent, mutually orthogonal annular coils to generate the magnetic field. The two coils are identical and connected together in series or, as illustrated in the figure, in parallel. The series or parallel combination is connected to a DC power supply 60. Preferably, the output current of the DC power supply 60 is controlled by a conventional microcontroller or micro-processor 65 to facilitate adjustment of the magnetic field strength by a human operator.

The first coil 40 is located at the 9 o'clock side (180° azimuth) of the wafer 20, is oriented perpendicular to the x-axis, and is connected to the DC power supply with a polarity which produces a magnetic field oriented along the x-axis, i.e., in the positive x-direction or the 0° azimuth direction.

The second coil 42 is located at the 12 o'clock side (90° azimuth) of the wafer 20, is oriented perpendicular to the y-axis, and is connected to the DC power supply 60 with a polarity which produces a magnetic field oriented along the y-axis, i.e., in the positive y-direction or the 90° azimuth direction. (To simplify the drawing, the chamber wall 12 surrounding the wafer is omitted from FIG. 2A and subsequent figures.)

The two coils produce a magnetic field in a region just above the wafer surface (specifically, in the region that includes the plasma sheath and pre-sheath adjacent the wafer) which is counterclockwise when viewed from above the wafer, looking down toward the wafer surface. In FIG. 2A the counterclockwise magnetic field pattern is represented by circular arcs 44a, 44b, 44c, 44d terminating in arrowheads pointing toward the second coil 42. Above the surface of the wafer 20, the magnetic field strength is greatest at the point P on the perimeter of the wafer at a 135° azimuth because the two coils are closest to each other at that point. The magnetic field is weakest at the point Q on the perimeter of the wafer at a 315° azimuth because the two coils are farthest from each other at that point. Another way of defining points P and Q is that they are the points on the wafer surface which are nearest and farthest, respectively, from the vertex "V" of the angle between the two electromagnet coils 40 and 42.

The counterclockwise magnetic field pattern produces an E×B drift of the free electrons in the plasma pre-sheath in a direction orthogonal to the field lines, as illustrated by the E×B vectors in FIG. 2A. More specifically, the E×B vectors at different points over the wafer surface point in different directions, but they always point away from the highest magnitude magnetic field line 44a and toward the lowest (magnitude magnetic field line 44d. For example, the E×B drift of the free electrons is away from the point P having the highest magnetic field strength and toward the point Q having the lowest magnetic field strength.

The spatial variation in magnetic field strength tends to produce the highest electron concentration in the pre-sheath near point P, and the lowest electron concentration in the pre-sheath near point Q. However, the orientation of the E×B vectors tends to produce the opposite result, i.e., the lowest and highest electron concentrations in the pre-sheath near points P and Q, respectively. Therefore, the effects of magnetic field strength variation and E×B drift tend to offset each other, thereby producing a more spatially uniform instantaneous distribution of free electrons in the pre-sheath adjacent the wafer surface.

This more spatially uniform instantaneous distribution of free electrons in the pre-sheath produces a more uniform instantaneous spatial distribution of ion flux bombarding the wafer, thereby reducing the risk of damage to semiconductor devices on the wafer.

As in conventional designs, the time-averaged uniformity of etch rate or deposition rate, in the case of etch chambers or CVD chambers, respectively, can be further improved by slowly rotating the two magnets relative to the wafer, or by rotating the wafer relative to the magnets. The rotation can be performed electrically, rather than mechanically, by providing an array of electromagnets encircling the workpiece, and powering the electromagnets in a sequence which causes the magnetic field to rotate around the center of the workpiece. This electrical rotation method is described in detail in the above-referenced co-pending application.

The two electromagnets are orthogonal in the case of FIG. 2A because such a geometry permits the electromagnets to be positioned as close as possible to a circular semiconductor wafer 20. However, a similar magnetic field pattern will be produced even if the angle between the two electromagnets is changed significantly. For example, FIG. 2B illustrates a modification of the design of FIG. 2A in which the electromagnetic coils 40, 42 are oriented at 180 degrees relative to one another.

Magnetic field distribution at a given moment in time from a typical energization scheme of the conventional MERIE four-coil system typically exhibits azimuthal non-uniformities in both magnitude and gradient. (Even greater nonuniformities are exhibited in a two-coil system.) Azimuthal nonuniformities may be partially averaged-out over time via a synchronized rotation of the energization of the four coils. Still, due to the four fold symmetry, complete azimuthal averaging is not possible, nor is the manipulation or homogenization of radial nonuniformities. As a result, conventional magnets cannot provide precise compensation for the E×B drift, and therefore cannot provide the optimum instantaneous ion flux distribution uniformity. In fact, it has been observed that such conventional magnets produce fields having as much as a 40% nonuniformity in either magnitude or gradient, so that compensation for E×B drift is inexact. Thus, the risk of device damage due to charge buildup remains a significant problem to be solved.

Another disadvantage of conventional magnets in MERIE reactors is that such magnets provide a predetermined field pattern, which may be rotated about the axis of the wafer but whose shape or distribution is otherwise not adjustable or controllable. Thus, the magnet must be designed to provide the best compensation for E×B drift possible for a particular reactor under a particular set of conditions. Any departure from those conditions may impair the compensation for E×B drift already impaired by the magnet's individually ability to provide a uniform field or gradient within a 40% variation. Moreover, any required corrections discovered in the production environment by the user cannot be implemented without physically modifying the magnet, a costly and time-consuming procedure.

SUMMARY OF THE DISCLOSURE

The invention is embodied in a magnetically enhanced plasma reactor for processing a semiconductor workpiece, including a reactor enclosure defining a vacuum chamber, a wafer support for holding the workpiece inside the chamber, a plasma power source for applying plasma source power into the chamber, a first plurality of electrically conductive elongate filaments each being of a finite length, distributed about a periphery of the chamber enclosure, each of said filaments extending at least generally in an axial direction relative to the chamber. The plurality of filaments is capable of permitting different currents through different ones of at least some of the filaments in accordance with a distribution of currents among the filaments corresponding to a desired magnetic field configuration. Respective current sources are preferably connected to deliver respective currents to different ones of the plurality of filaments. Preferably, the respective current sources apply different currents to different ones of the filaments in accordance with the distribution of currents among the filaments corresponding to the desired magnetic field configuration. Preferably, the filaments are generally mutually parallel. Preferably, the currents flowing through adjacent ones of the plural filaments are in the same direction.

The workpiece is generally planar and the filaments extend generally perpendicular with respect to the planar workpiece in a preferred embodiment. The filaments are arranged generally in a circle and extend perpendicularly to the plane of the circle, in the preferred embodiment. The respective current sources provide respective currents to respective groups of the filaments in accordance with the distribution of currents among the respective groups corresponding to the desired magnetic field configuration. Preferably, the filaments are distributed generally in a cylinder about the enclosure and extend axially with respect to the cylinder, the distribution of currents being in accordance with a periodic pattern around the cylinder. Preferably, the periodic pattern is sinusoidal in $N\theta$, where $\theta$ is an angle of azimuth about the cylinder and $2N$ corresponds to the number of alternating polarity equi-scalar potential magnetic poles giving the desired magnetic field configuration.

Preferably, the filaments are radially interior segments of coil windings wrapped around a yoke encircling the plasma reactor. The coil windings are mutually parallel and orthogonal to the local circumference of the yoke at each winding. The yoke, which may be divided into azimuthal segments, has sufficient magnetic permeability and radial thickness to effectively shield the chamber from magnetic fields generated by the return filaments. Preferably, the currents flowing through adjacent ones of the filaments are in the same direction.

Preferably, the filaments are distributed generally in a cylinder about the enclosure and extend axially with respect to the cylinder, the distribution of currents being in accordance with a chosen pattern around the cylinder. The pattern may be sinusoidal in $N\theta$, where $\theta$ is an angle of azimuth about the cylinder and $2N$ corresponds to the number of alternating polarity equi-scalar potential magnetic poles in the desired magnetic field configuration. The pattern may include a superposition of respective patterns sinusoidal in $N\theta$ for respective values of N.

In a preferred implementation, a second plurality of coil windings are distributed about a periphery of the chamber enclosure, each of the second plurality of coil windings extending at least generally in an axial direction relative to the chamber, the second plurality of coil windings being parallel to and axially displaced from the first plurality of coil windings by a gap providing ingress and egress of the workpiece in the chamber, the second plurality of coil windings being capable of permitting different currents through different ones of the second plurality of coil windings in accordance with a distribution of currents among the coil windings corresponding to a desired magnetic field configuration.

A magnetically permeable shield may be provided which surrounds the coil windings, the shield being of sufficient magnetic permeability to suppress magnetic fields from the coil windings from extending radially outwardly beyond the shield. A pair of magnetically permeable shielding caps may be provided to cover the top and bottom axial ends of the annular yoke. In an embodiment in which the yoke is axially split in half forming a gap to provide wafer ingress and egress therethrough, magnetically permeable lips may be provided around the gap or wafer access port.

DETAILED DESCRIPTION OF THE PREFERRED EMBODIMENTS

Concept of the Invention

Figure 3:
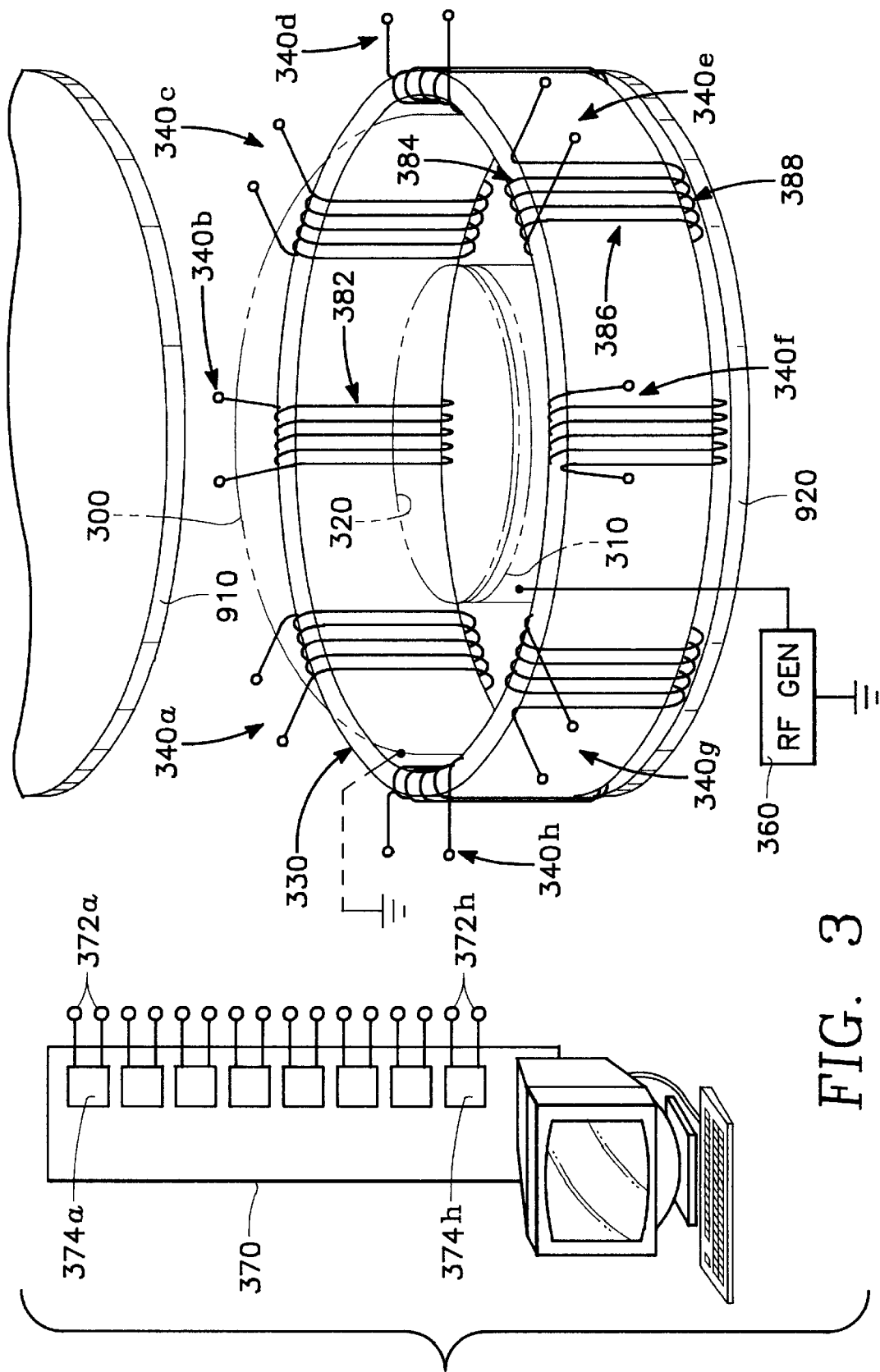
FIG. 3 illustrates a plasma reactor including a multiple independently-driven coil magnet embodying the present invention.

FIG. 3 illustrates an MERIE plasma reactor including a magnet embodying the present invention. The reactor consists of a reactor vacuum enclosure including a ceiling 300 shown in dashed line. The reactor vacuum enclosure defines a chamber interior. A wafer pedestal 310 inside the chamber interior supports a semiconductor workpiece or wafer 320 to be processed by the reactor. An annular magnetic yoke 330 consisting preferably of iron surrounds the side of the reactor enclosure. A set of coils 340a–340h electrically isolated from one another are wrapped radially around the yoke 330 at respective azimuthal positions of the yoke 330. Each individual coil 340 consists of a number of windings of a conductive wire. An RF power generator 360 is connected between the wafer pedestal 310 and RF ground, and the ceiling 300 is grounded, thereby establishing an RF potential between the wafer 320 and the ceiling 300 which maintains the gases inside the chamber in a plasma state. The currents flowing through the individual coils 340 are controlled by a multiple current generator 370 having multiple current output terminal pairs 372a–372h. Each output terminal pair is connected to the pair of ends of a respective one of the coils 340. Thus, for example, the current output terminal pair 372a supplies the current through the coil 340a while the current output terminal pair 372b supplies the current through the coil 340b, and so forth. The multiple current generator may be thought of as consisting of a set of separate current generators 374a–374h whose outputs are respective ones of the output terminal pairs 372a–372h. Preferably, a pair of magnetically permeable shielding end caps 910, 920 cover the top and bottom axial ends, respectively, of the annular yoke 330.

One advantage of the invention is that there are no adjacent cent opposing currents, in contrast to the prior art. Specifically, the iron yoke 330 shields the chamber interior from any opposing currents. That this is so may be seen by considering the respective locations of each segment of a typical current-carrying filament in a coil 340. Each filament is a single winding of the coil 340 and consists of a vertical interior segment 382 adjacent the inner radius of the yoke 330, a top horizontal segment 384 adjacent the top surface of the yoke 330, a vertical exterior return segment 386 adjacent the outer radius of the yoke 330 and a horizontal bottom segment 388 adjacent the bottom surface of the yoke 330. The currents in the two vertical segments 382 and 386 are opposite. However, the opposing current in the return segment 386 is magnetically shielded by the yoke 330 from the chamber interior. The currents in the horizontal segments 384, 388 have negligible effect upon the magnetic field in the chamber interior. Therefore, only the vertical interior segment 382 of each current-carrying filament affects the magnetic field inside the chamber. Within each coil 340, there are several interior segments 382, and the current flow through each of them is in the same direction. Therefore, there are no opposing currents within a given coil 340. Since the currents in the respective coils are individually adjustable, they can all be selected in such a manner that current flow through all interior vertical segments 382 of all coils 340 varies slowly or not at all in the azimuthal direction, so that there are no adjacent opposing currents or fields, a significant advantage.

In one method of operating the magnet, the currents through all the coils 340 are constant in time but vary as a function of the azimuthal location of each coil 340. By employing different patterns of currents among the different coils 340, virtually any magnetic field configuration may be realized in the chamber interior without requiring modification of the magnet physical layout, a significant advantage. More accurately stated, in two dimensions, any 2-dimensional source-free magnetic field configuration, slightly adjusted for the finite chamber height, may be realized, as will be described in detail below. In accordance with a preferred embodiment, the pattern of individual currents among the different coils 340 varies periodically as a function of azimuthal position (i.e., azimuthal angular position) of the individual coil location. The pattern may vary as a sum over N of sine or cosine functions of $N\theta$, where $\theta$ is the azimuthal angle. Alternatively, the pattern may vary as a simple sine or cosine function of the azimuthal angle $\theta$, so that each individual current is equal to a constant magnitude multiplied by $\cos(N\theta)$. In this case, for a perfectly uniform magnetic field in the chamber interior, N=1 and the coils 340a–340h establish a magnetic dipole, in a first mode of operation. For a perfectly uniform magnetic field gradient within the chamber, N=2 and the coils 340a–340h establish a magnetic quadrupole, in a second mode of operation. For N=3, a magnetic sextupole is established, in a third mode of operation. In general, the number of magnetic poles is 2N, so that a mode may be referred to as a magnetic 2N-pole (e.g., magnetic dipole, quadrupole, sextupole and so forth).

By an appropriate combination (e.g., a linear superposition) of various ones of the operational modes, a desired magnetic field configuration is realized. Thus, the magnetic field inside the chamber may be radically modified or slightly refined to achieve a desired magnetic field shape by the convenient expedient of controlling the individual currents output by the multiple current generator, a significant advantage. For example, the magnetic field shape can be selected to at least ameliorate or reduce the E×B drift of the ion flux so as to achieve an instantaneously more uniform ion flux distribution.

Another advantage of the invention is that the coils 340 may be uniformly spaced and, with a sufficiently large number of coils 340, the "corner" effect prevalent in MERIE reactors (due to the discontinuities in the magnet configuration involving, for example, only two or four magnets) is eliminated.

In addition to the foregoing features, the current pattern distribution among the coils 340 may be rotated through $\theta$ at some desired rate (e.g., 1–5 Hz) by correspondingly time-varying the currents in the coils 340.

An exemplary implementation of the concept illustrated in FIG. 3 will now be described in the form of a working example. This exemplary implementation is specifically intended for use in a magnetically enhanced plasma etch system for 30 cm wafers. In this description, analytical methods for selecting key design parameters based upon magnetic field strength and configuration are developed and presented. In addition, calculations of such design parameters for the exemplary implementation are presented. Two dimensional electromagnetic theory and calculations provide the primary basis for the selection of design parameters of the exemplary implementation. Three dimensional electromagnetic theory and calculations are developed to examine perturbations to the two dimensional field characteristics resulting from finite length and a midplane split accommodating wafer access.

The invention preferably includes the capability for varying the field shape by varying the current distribution in an azimuthal array of coils (i.e., by individually varying currents in the respective coils). The field can be rotated by properly phasing sinusoidal temporal variations of coil currents. Addition of an iron annular shield enclosing the magnet limits external fields, but restricts the magnet's ultimate field strength capability.

Capabilities of the Magnet of the Exemplary Implementation

The magnetic field strength and shape are adjustable because the coils are separately powered. In particular, central field strength and field gradient are independently adjustable, a significant advantage. The magnet is capable of producing a uniform field of 100 G over the entire 30 cm wafer (case 1 as considered in the following sections) to within on the order of 1% uniformity or a uniform gradient with 100 G at one extreme of the wafer while at the opposite extreme the field is 0 G (case 2 as considered in the following sections) to within on the order of 1%. (Such a degree of uniformity represents a revolutionary improvement over other plasma reactor magnets, which have exhibited uniformities to within 5% at best.) Case 2 is equivalent to a central field of 50 G with a field gradient of 3.33 G/cm. The magnet is capable of rotating the field orientation at a rate of at least 1 Hz. An outer shield (not illustrated in FIG. 3) is provided so that a field strength of 5 G is not exceeded outside the enclosure. Average magnetic fields within the iron elements are held to $H \leq 100$ Oe, corresponding to an iron flux density $B_{iron} = 18$ kG, to avoid saturation and loss of useful Amp-turns.

The outer radius of the package containing the magnet of the present implementation is 41 cm. The inner radius, enveloping the reactor chamber, is 31.5 cm. An access port is required for wafer insertion. This requires a vertical gap near the midplane of 6 cm over an angular extent of approximately 90°. As will be described in greater detail below, azimuthal symmetry is maintained by splitting the magnet yoke into a top and bottom ring, so that the 6 cm gap extends 360° of azimuth. The height of the package containing the magnets is about 44 cm.

2-Dimensional Physical Layout

Figure 4:
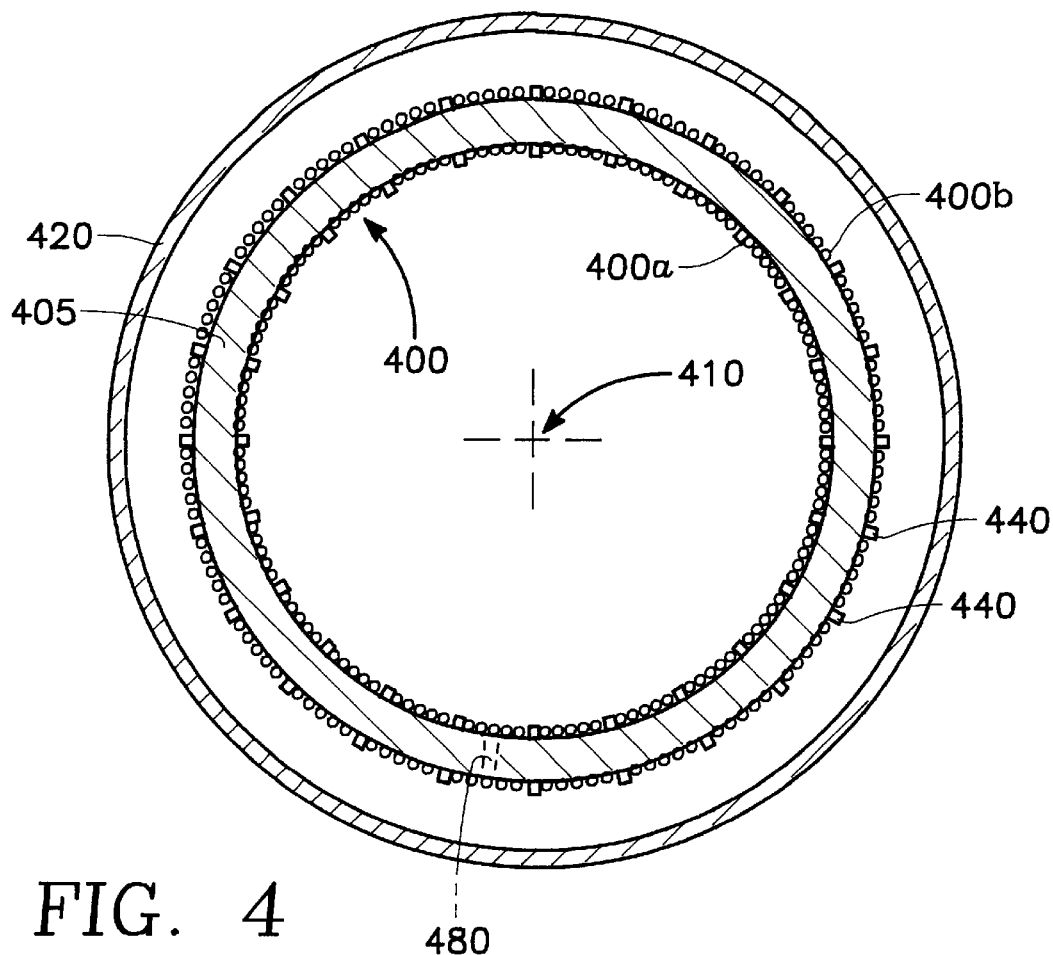
FIG. 4 is a top cross-sectional view of an exemplary implementation of the magnet of the present invention.

FIG. 4 is a cross-sectional view illustrating the two-dimensional features of the magnet of the present implementation. The design consists of a cylindrical arrangement with an azimuthal array of 24 coils 400 wound around a soft iron yoke 405. (It should be noted that in other implementations of the invention, a different number of coils—other than 24—may constitute the array of coils, and their arrangement may not necessarily be cylindrical.) Each coil 400 is wound such that current flows parallel to the magnet axis 410. Visible in FIG. 4 is each coil's inward-facing current filaments 400a and outward-facing current returns 400b. Each coil 400 and its associated current distribution inside of the steel yoke's inner radius controls the field strength and shape in the etch chamber. The yoke 405 shields the inner region (the etch chamber) from the influence of the current returns 400b, as well as other external fields. However, the current flow in the current returns 400b produces a magnetic field beyond the outer radius yoke. A second soft iron annular shield 420 enclosing the inner yoke 405 and coil returns 400b is included to limit the field external of the reactor enclosure.

The magnetic field properties within the region of interest, i.e., in the etch chamber, are completely controlled by the coil current distribution inside the inner radius of the yoke 405, i.e., by the current flow in the interior current elements 400a. The current returns 400b outside the yoke 405 either produce external fields, or, when the outer shield 420 is included, produce considerable flux through the yoke 405 and shield 420, which, in turn, requires that the yoke 405 and shield 420 have much thicker cross sections to avoid saturation. For some modes of excitations, the net current linked by the yoke 405 is, by design, zero. In other words, for each positive element of current, there is a corresponding negative element. However, the relative placement of corresponding positive and negative currents determines the field shape. Therefore, without independent return 400b for each of the current elements 400a inside the yoke 405, flexibility of changing field shape would be sacrificed.

The field is shaped within the chamber by the superposition of a harmonic series of current distributions (one term in the series is of the form $I_{O_N} \cos N\theta$). The ideal distribution of current is continuous. The exemplary implementation uses 24 discrete coils 400 to approximate a continuous distribution. Although our computer simulations of the exemplary embodiment's performance show that a 12 coil configuration is sufficient to satisfy magnetic uniformity and tunability requirements, a 24 coil arrangement allows more flexibility. Depending upon the power supply characteristics, the magnet can be configured in either a 24 coil or a 12 coil (with two adjacent coils connected in series) arrangement. (Other implementations may use a different number of coils.) The exemplary implementation incorporates cooling circuits 440 between each of the coils 400.

The magnetic field characteristics, strength, shape, and orientation, are determined by currents in each of the coils 400. The orientation of a particular shape and strength field can be rotated by using a sinusoidal temporal variation in each of the power supplies. In one mode of operation, in which the magnet establishes a magnetic dipole field, the current supplied to each individual coil 400 preferably has the same time domain waveform, but successive coils have a phase difference of 1/24 of the period (or 1/12 for 12 independent circuits).

Coil Design

Each coil 400 is a package including a total of 150 turns of #12 wire in five layers. This allows a total of 3000 Amp-turns, with 20 A in each turn, which is approximately 40% more than is required to produce a gradient field of 0–100 G over $|r| \leq 15$ cm. The selected current of 20 A per turn makes coil cooling preferable. Space is provided for the 0.5" cooling circuit 440 between adjacent coils 400. Thermocouples should preferably are embedded in each coil package for thermal monitoring.

Each coil or coil package 400 is approximately 1.2 cm thick and spans approximately 12.7°. Assuming a height of 20.3 cm for both the top and bottom rings, a coil circuit which includes the top and bottom coil has a length of 82.6 cm per turn. The total resistance for 150 turns is $R=0.64\Omega$. For $I=20$ A, the coil voltage is $V=12.86$ V. For a sinusoidally varying current with a peak magnitude of 20 A per turn, the RMS power in each of 24 coil circuits is $P_{rms}=128$ W.

Current Excitations, Eddy Currents and Inductance

The analysis that follows in this specification assumes that the magnetic circuit corresponding to the iron yoke 405 is azimuthally continuous and uniform, i.e., there are no gaps parallel to the magnet's axis 410. The magnetic behavior of the coil and iron system as far as current excitations, inductance, and eddy currents are concerned is fundamentally different if the yoke is azimuthally segmented. In particular, small azimuthal gaps in the yoke 405 (e.g., such as a gap 480 indicated in dashed line in FIG. 4) will help limit eddy currents, and will allow more flexibility in the use of controlled non-multipole current excitations, as will be discussed below in greater detail. However, in the exemplary embodiment analyzed herein, there is no such azimuthal gap in the yoke 405.

Current Excitation From Ampere's law, the integral of H·ds around any closed loop equals the enclosed current:

$$\oint H \cdot ds = \mu_0 I \tag{1}$$

If the plasma etch chamber magnet is energized with any mix of dipole, quadrupole, and sextupole modes (see Eqs. 10 and 15 below), the net current enclosed by a loop over $2\pi$ in the yoke is zero and $\oint H \cdot ds$ in the iron is zero. If, however, $\Sigma I$ around $2\pi \neq 0$ at any instant in time, either due to an inadvertent current timing mismatch or by a purposeful energization giving an infinite series multipole distribution (e.g. Eqns. 12 and 13 below with M=1), then saturation of the iron is a possibility. The B-H curve for 1010 steel is well-known in the art. For a chamber with a yoke circumference of $2\pi R_c 200$ cm, a net current imbalance of 100 A, 200 A, and 300 A result in a values of $H_{iron}$ of 0.625 Oe, 1.250 Oe and 1.875 Oe, respectively. These values correspond to values of incremental iron flux density of 400 G, 2500 G, and 5000 G. An inadvertent net current mismatch of $\Sigma I_m \leq 100$ A will produce an acceptably low incremental iron flux density. This energization corresponds to 0.67 A in a 150 turn coil, a realizable level of control. If an infinite series multipole distribution were desired, azimuthal segmentation of the yoke would be prudent. A total azimuthal gap (e.g., the gap 480 in FIG. 4) of 1 cm would limit the rise of incremental iron flux density in a single 3000 A source to 3750 G. Such gaps placed at periodic azimuthal locations, would not significantly affect the magnetic field distribution inside the chamber.

Eddy Currents

For rotation of the etch chamber field via coil current cycling, eddy currents are induced in nearby conductive materials, such as the magnetic yoke and the aluminum etch chamber wall. These eddy currents have the effect of nulling a portion of the desired field. At 1 Hz though, the effect is not large. If the iron yoke and shield are segmented into many disks, cycling at higher frequencies without significant reduction in field strength would be enabled. The azimuthal segmentation considered in the last section will also reduce eddy currents, but this will only be effective if many segments are used. Note that since aluminum is more conductive than iron (or steel), the etch chamber wall represents the most significant source of eddy currents. Therefore, segmentation of the yoke will not reduce eddy currents unless the etch chamber is also segmented.

Inductance

The presence of the iron yoke 405 increases coil inductance. Typically, for 10 A in 150 turns and a value of $B_{iron}$ of 18000 G over $2.8 \cdot 19$ cm$^2$, coil inductance L=144 mH. The inductance of each current generator 374 in the multiple current power supply 372 of FIG. 3 is preferably in a range of about 30 to 70 mH for the exemplary implementation of FIG. 4.

2-Dimensional Analysis and Computations

A 2-dimensional theoretical analysis of the exemplary embodiment of FIG. 4 will now be given, along with computations of optimum values of certain key design parameters. The 2-dimensional analysis is idealized, but provides a simple approach yielding results relatively close to real-world performance.

1. Multipole Definition

In a source-free region fields can be described by Maxwell's equations as follows:

$$\vec{\nabla} \times \vec{E} = -\frac{\partial \vec{B}}{\partial t} \Rightarrow \vec{\nabla} \cdot \vec{B} = 0, \vec{\nabla} \times \vec{H} = 0 \tag{2}$$

where $B = \mu_0 H$. H (and thus B) can be expressed as the gradient of a scalar potential V or, alternatively, as the curl of a vector potential A:

$$\mu_0 \vec{H} = -\nabla V, \vec{B} = \vec{\nabla} \times \vec{A}. \tag{3}$$

For two dimensional fields A and V satisfy the Cauchy-Riemann conditions $A'_x = V'_y$ and $V'_x = -A'_y$, and can thus be represented as the real and imaginary parts of an analytic function F of the complex variable $z \equiv x + iy$:

$$F \equiv A + iV. \tag{4}$$

It follows from Eqns. 3 and 4 that the complex conjugate $B^*(z)$ of the field is also analytic in z and is given by:

$$B^*(z) = i\frac{dF}{dz}. \tag{5}$$

It is convenient to expand the complex potential F in a power series about a point (say z=0) and analyze the harmonic components, or multipoles:

$$F(z) = \sum_{n=1}^{\infty} \left(\frac{z}{r_p}\right)^n c_n; B^*(z) = i\sum_{n=1}^{\infty} \left(\frac{z}{r_p}\right)^{n-1} B_n \tag{6}$$

where $r_p$ is any convenient normalization radius, typically the magnet aperture radius (or half gap h for a dipole), and $B_n = nc_n/r_p$. For magnets exhibiting midplane symmetry, the coefficients $c_n \equiv a_n + ib_n$ are pure real (or pure imaginary if A, rather than V, is constant along the midplane). For symmetric multipole magnets (i.e., rotatable by 360/2N with a change of polarity), of order N (e.g., N=1 for dipole, 2 for quadrupole, etc.) the complex potential F and flux density B* are given by $$F(z) = \sum_{n=1}^{\infty} \left(\frac{z}{r_p}\right)^{N(2n-1)} a_{N(2n-1)}; \tag{7}$$

$$B^*(z) = i \sum_{n=1}^{\infty} \left(\frac{z}{r_p}\right)^{N(2n-1)-1} \frac{N(2n-1)a_{N(2n-1)}}{r_p}. \tag{8}$$

2. Multipole Generation via cos(Nθ) Current Distribution

In two dimensions, the field produced by a current filament of magnitude $I_0$ at $z_0$ is given by $$B^*(z) = \frac{\mu_0 I_0}{2\pi i(z - z_0)} \tag{9}$$

where the value for free-space permeability is $\mu_0$=0.4 π [G-cm/A].

Figure 5:
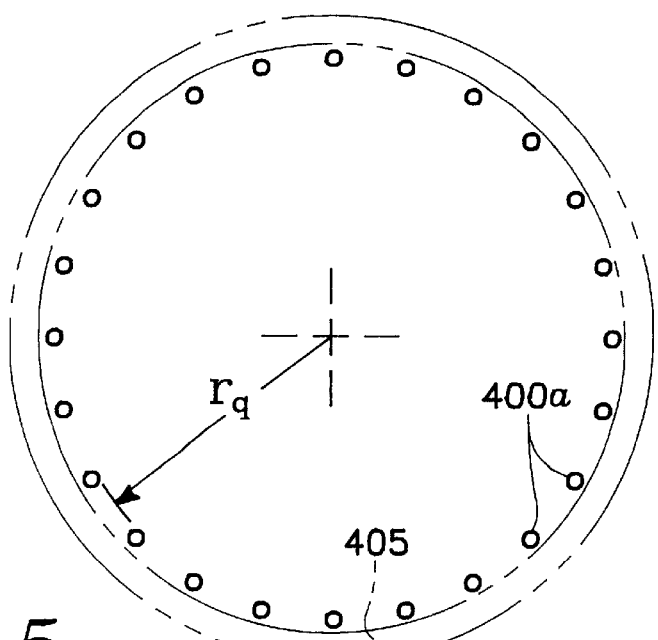
FIG. 5 is a top view of the interior current filaments, only, of exemplary implementation, for consideration in a 2-dimensional design analysis.

For M interior current carrying filaments 400a uniformly spaced around a circle of radius $r_q$ as shown in FIG. 5 (i.e., ignoring the current returns 400b of FIG. 4 because they are shielded by the yoke 405 from the interior region), the current magnitude of the $m^{th}$ filament is given by $$I_m \text{ [amps]} = I_{0_N} \cos(2\pi m N/M), z_m = r_q e^{i2\pi m/M}, 0 \leq m \leq M-1 \tag{10}$$

where the multipole designation N is a positive integer. Note that for a continuously distributed current, or for large M, the total amperage $\hat{I}_0$ in π/2N is $$\hat{I}_{0_N} = I_{0_N}/(2\pi N/M). \tag{11}$$

The magnetic flux density at any z is:

$$B^*(z) = \sum_{m=0}^{M-1} \frac{\mu_0 I_m}{2\pi i(z - z_m)} = \sum_{m=0}^{M-1} \frac{\mu_0 I_0 \cos(2\pi m N/M)}{2\pi i(z - z_m)} \tag{12}$$

$$= \frac{\mu_0 I_0}{2\pi i z} \sum_{n=1}^{\infty} \sum_{m=0}^{M-1} \cos\frac{2\pi m N}{M} \left\{ \begin{array}{ll} -(z/z_m)^n, & |z| < |z_m| \\ (z_m/z)^{n-1}, & |z| > |z_m| \end{array} \right\} \tag{13}$$

For large M, the second summation approaches a continuous integral and all terms in the first summation vanish except for the term n=N. The equation for $B^*_N$ for this case is given by:

$$B^*_N(z) = \frac{\mu_0 \hat{I}_{0_N} N}{2 r_q} \left\{ \begin{array}{ll} (-1)(z/r_q)^{N-1}, & |z| < r_q \\ (r_q/z)^{N+1}, & |z| > r_q \end{array} \right\}. \tag{14}$$

This equation is a very good approximation at all locations not in the immediate vicinity of a current element.

Figure 6:
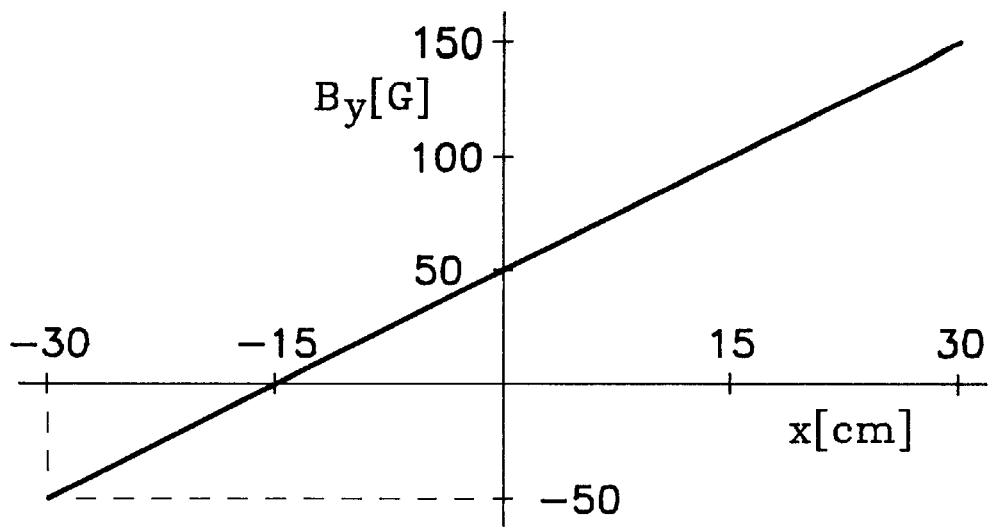
FIG. 6 is a graph illustrating the magnetic field strength distribution of a magnetic field having a uniform gradient, in accordance with one mode of the invention.

For example, for a desired uniform iB*=100 G in a chamber of radius $r_q$=30 cm, with M=24 filaments [case 1], the required maximum filament current $I_0$=1250 A. The total amperage over π/2 is $\hat{I}_0$=4775 A. If a field gradient of 0–100 G over |r|<15 cm is desired with the same geometry [case 2], as shown in FIG. 6, then iB*[G]=50+100z/$r_q$, $B_1$=50 G and $B_2$=100 G. The required amperage over π/2 is $\hat{I}_0 \equiv \hat{I}_{0_1} + 2 \cdot \hat{I}_{0_2}$ = 2387+(2·2387)=7161 A, and $I_0 = I_{0_1} + I_{0_2}$ = 625+1250=1875 A.

3. Chamber Field Enhancement due to Iron Yoke

Figure 7:
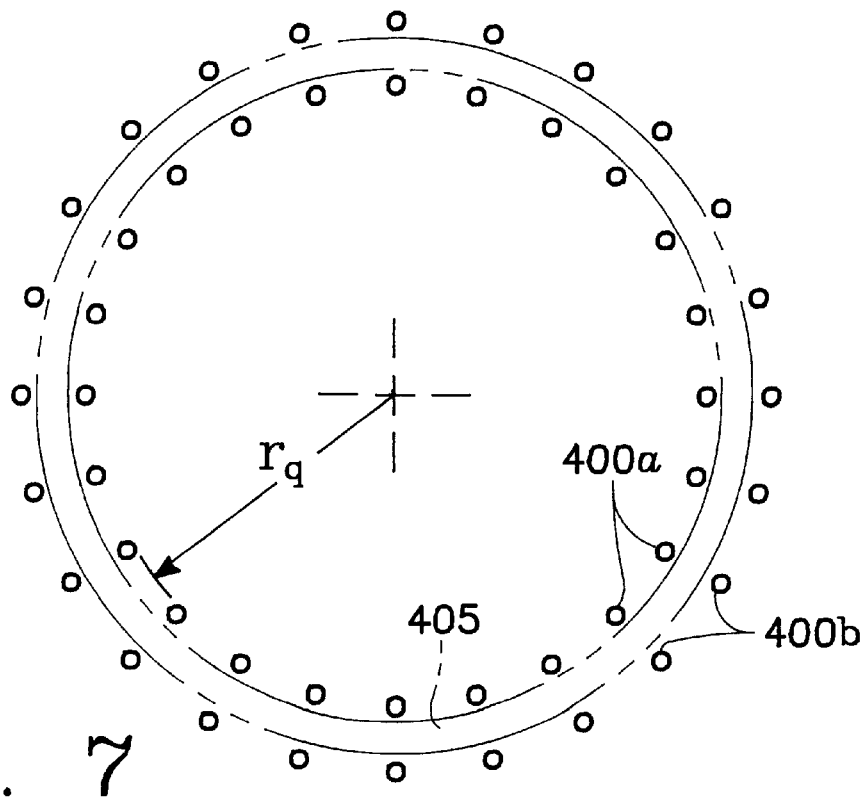
FIG. 7 is a top cross-sectional view of the magnet of the exemplary implementation illustrating the interior current filaments, the iron yoke and the exterior current return filaments adjacent the outer circumference of the yoke.

The foregoing analysis of the current filament geometry ignores the current returns 400b for each of the filaments 400a. If the "ends" are sufficiently far away, the current in the filament located at $z_m$ could be returned through the filament located at $z_m e^{i\pi/N}$ if N were fixed (i.e., the multipole mix does not change). Instead, and preferably, the yoke 405 is present and consists of high magnetic permeability iron immediately outside the ring of current filaments. The current in each filament 400a can be returned outside the yoke 405 through current returns 400b, as shown in FIG. 7.

Assuming that the iron does not saturate, the yoke 405 can be approximated as infinitely permeable material. The addition of this yoke immediately outside the original ring of filaments effectively doubles the field at all locations inside. Neglecting the $\Delta r_q$ due to the iron thickness, the field doubles outside as well (with a change of sign):

$$B^*_N(z) = \frac{-\mu_0 \hat{I}_{0_N} N}{r_q i} \left\{ \begin{array}{ll} (z/r_q)^{N-1}, & |z| < r_q \\ (r_q/z)^{N+1}, & |z| > r_q \end{array} \right\}. \tag{15}$$

Now reconsider the two examples from the previous section. For the desired uniform field case (iB*=100 G) now surrounded by an iron yoke, the required maximum filament current $I_0$=625 A. The total amperage over π/2 is $\hat{I}_0$=2387 A. For the 0–100 G gradient case, the required amperage over π/2 is $\hat{I}_0 \equiv \hat{I}_{0_1} + 2 \cdot \hat{I}_{0_2}$ = 1193+2387=3580 A, and $I_0$=937 A. Note that for both cases, the currents values are half of those for the previously considered no-iron cases.

The iron yoke thickness $t_{y_f}$ required to carry the flux generated by the original ring of filaments is, using Eqn. 15:

$$t_{y_f} B_{iron} = \int_0^{\pi/2N} \left(\vec{B}_N \cdot \vec{n}\right) r_q d\theta = \int_0^{\pi/2N} \text{Re}(B^*_N(z)z) d\theta = \mu_0 \hat{I}_{0_N} \tag{16}$$

where $B_{iron}$=18 kG is the target flux density in the iron, $\vec{B}_N$ is the field inside the filament ring, and $\vec{n}$ is the normal to the filament ring. The yoke thickness, $t_{y_r}$, required to carry the flux generated by the filament returns, when positioned immediately outside the yoke (assuming the total yoke thickness $t_y$<<$r_q$) is $$t_{y_r} B_{iron} = \int_0^{\pi/2N} \left(\vec{B}_N \cdot \vec{n}\right) r_q d\theta = \int_0^{\pi/2N} \text{Re}(B^*_N(z)z) d\theta = \mu_0 \hat{I}_{0_N} \tag{17}$$

where here $\vec{B}_N$ is the field outside the return filament ring. Thus for a desired field distribution $$iB^*(z) = B_1 + B_2(z/r_q) + B_3(z/r_q)^2 + \ldots \tag{18}$$

The required yoke thickness is $$t_y \equiv t_{y_f} + t_{y_r} = 2\frac{r_q}{B_{iron}} \left(\frac{B_1}{1} + \frac{B_2}{2} + \frac{B_3}{3} + \ldots\right) \tag{19}$$

If $t_y$ is thinner than this value, the iron will start to saturate and limit both attainable flux density magnitude and uniformity within the chamber. For the uniform 100 G field case considered above, and iron thickness of $t_y$=2$t_{y_f}$=2$t_{y_r}$=0.33 cm will result in a flux density $B_{iron}$=18 kG in the iron. For case 2, (0–100 G over |r|≦15 cm), $t_y$·2·30/18000(50/1+100/2)= 0.33 cm also.

4. External Shielding

The iron yoke 405 permits convenient positioning of filament returns, and as discussed above effectively doubles the field in the chamber region within the annulus due to the "mirror effect" of the high permeability material adjacent the filaments. The yoke 405 also shields the chamber from external magnetic field sources. However, as noted previously, the filament returns outside of the iron yoke produce external fields. These are most effectively shielded from surrounding regions by the outer shield 420 consisting of high permeability material, the shield 420 being placed as far as possible from the sources (i.e., the filament returns 400b). In general, flux loops are driven through the shield 420 and yoke 405. The magnitude of the flux is inversely proportional to the distance between the annular outer shield 420 and the annular inner yoke 405. Shielding close to the current returns 400b and the yoke 405 will dramatically increase the required iron thickness in both the shield and the yoke in order to avoid saturation.

Figure 8:
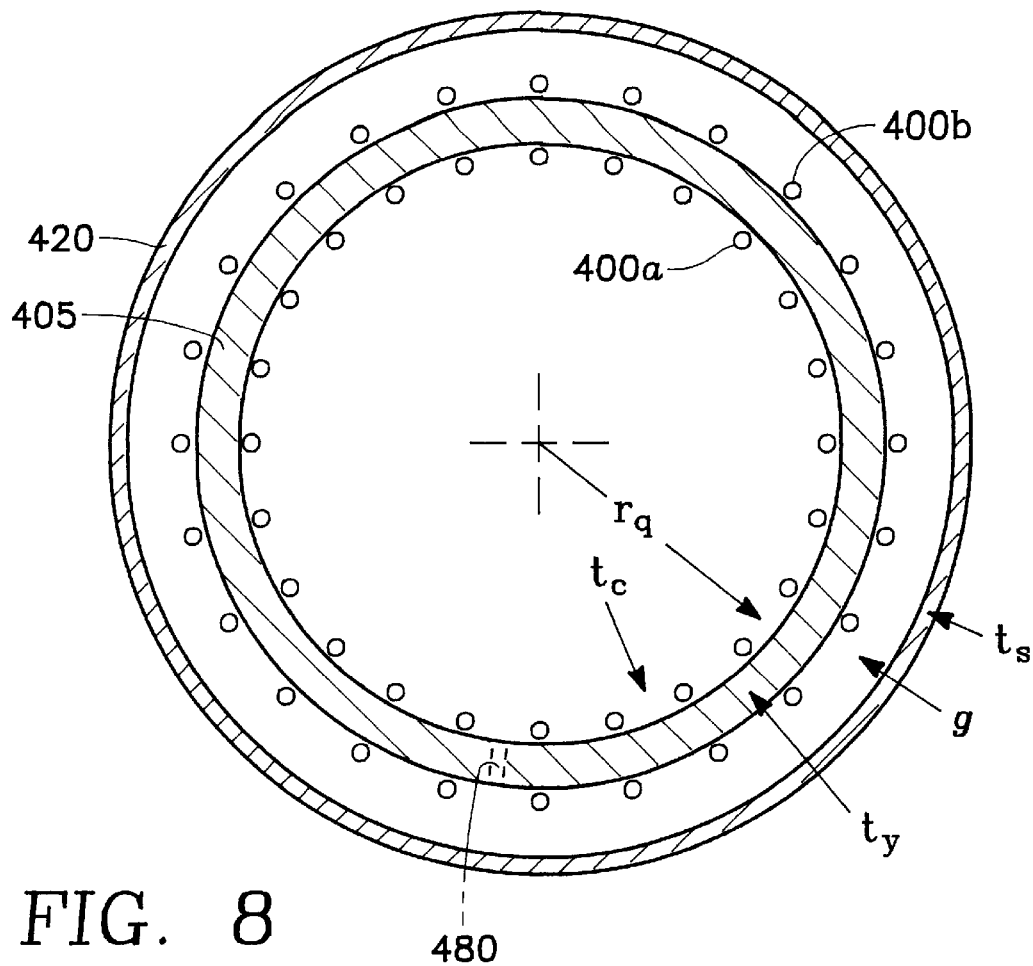
FIG. 8 is a top cross-sectional view of the magnet of the exemplary implementation illustrating the interior current filaments, the iron yoke, the exterior current return filaments and a shield surrounding the current return filaments.

At this point, the outer shield 420 enclosing the current returns 400b is now introduced into the analysis. This geometry, illustrated in FIG. 8, provides independent shielding for each reactor chamber (where many reactors are placed in close proximity) while minimizing the total package thickness.

Figure 9:
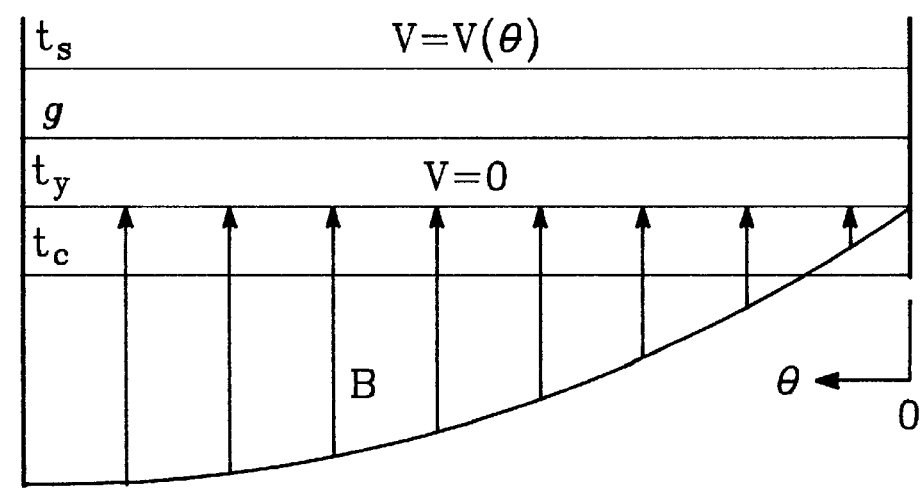
FIG. 9 is a graph illustrating the component of the field normal to the yoke as a function of azimuthal position in the implementation of FIG. 8 excited in accordance with the dipole mode.

FIG. 9 shows a schematic of one quarter of the magnet "unfolded", illustrating the variation with the azimuthal angle of the component of the magnetic field normal to the yoke. The additional presence of the outer iron shielding annulus 420 causes increased flux through the existing yoke 405, and thereby requires an increased thickness $t_{y_r}$. The required total shielding package thickness, $f \equiv t_{y_r} + g + t_s$, and optimized thickness of inner and outer iron annulus and gap dimension can be determined from the variation of vector and scalar potentials along the outer annulus surface:

$$A(\theta) = \int_\theta^{\pi/2N} \frac{V(\theta)}{g} r d\theta, \text{ where } r \approx r_q. \quad (20)$$

The flux density in the yoke and shield are $$B_s(\theta) = A(\theta)/t_s; \quad B_y(\theta) = A(\theta)/t_{y_r}. \quad (21)$$

Our goal is to minimize the total dimension f for $B_s(0)$, $B_y(0) \leq B_{iron}$. Thus $$B_{iron} = A(0)/t_y = A(0)/t_s \Rightarrow t_{y_r} = t_s \equiv t. \quad (22)$$

Combining this result with Eq. 20 gives:

$$gt = \frac{r_q}{B_{iron}} \int_0^{\pi/2N} V(\theta) d\theta \equiv c^2. \quad (23)$$

To minimize the calculated thickness:

$$f \equiv t_s + g + t_{y_r} = 2t + c^2/t; \quad (24)$$

$$f' = 2 - c^2/t^2 = 0 @ t = \sqrt{c^2/2}$$

and $$f = f_{\min}(=2g) \text{ at } t = \sqrt{c^2/2}, g = \sqrt{2c^2} = 2t. \quad (25)$$

The optimum geometry is $g = 2t_{y_r} = 2t_s$ no matter what the magnitude or shape of the excitation is.

For arbitrary excitation, from Eqs. 10 and 11, $$V(\theta) = \sum_N \mu_0 \hat{I}_{0_N} \sin N\theta \quad (26)$$

we have $$c^2 = \frac{r_q}{B_{iron}} \sum_N \int_0^{2\pi/N} \mu_0 \hat{I}_{0_N} \sin N\theta d\theta = \frac{r_q}{B_{iron}} \sum_N \frac{\mu_0 \hat{I}_{0_N}}{N}. \quad (27)$$

A subtlety reflected in the upper limit of integration, which differs for the various multipoles, is that only the portion of the flux entering the shield which is returned through the azimuth at $\theta = 0°$ is counted.

The total package thickness is $$f + t_{y_f} = 2\sqrt{\frac{2r_q \sum_N \frac{\mu_0 \hat{I}_{0_N}}{N}}{B_{iron}}} + \frac{r_q}{B_{iron}} \sum_N \frac{B_N}{N} \quad (28)$$

$$= r_q \left( 2\sqrt{2} \sqrt{\sum_N \frac{B_N}{B_{iron} N^2}} + \sum_N \frac{B_N}{B_{iron} N} \right) \quad (29)$$

A subtlety, reflected by summing before taking the square root, is that the gap between the yoke and shield is counted only once, irrespective of the number of multipole contributions to the yoke and shield thickness.

For the uniform iB*=100 G case, the total package thickness $$t_{y_f} + t_{y_r} + g + t_s \equiv t_{y_f} + f = 0.17 + 6.32 = 6.5 \text{ cm}.$$

For the 0–100 G gradient case, $B_1 = 50$ G, and $B_2 = 100$ G, and we have $$t_{y_f} + f = 30 \left( 2\sqrt{2} \sqrt{\frac{50}{1^2 \cdot 18000} + \frac{100}{2^2 \cdot 18000}} + \left( \frac{50}{18000} + \frac{100}{2 \cdot 18000} \right) \right)$$

$$= 5.47 + 0.17 = 5.6 \text{ cm}.$$

where $B_{iron} = 18$ kG. For $B^*_N/B_{iron} \leq 0.08$ the second term in Eq., corresponding to $t_{y_f}$, may be neglected, yielding $$\left( \frac{f}{r_q} \right) \left( \sqrt{\sum_N \frac{B_N}{B_{iron} N^2}} \right) \geq 2\sqrt{2}. \quad (30)$$

Comparing the required thickness for these examples to that for the same cases without shielding from the previous section, illustrates the price in space, weight, etc. that the shielding exacts. If magnetic saturation of the iron is avoided, then the required amperage is unaffected by the presence of the shield.

5. Results from Two-dimensional Modeling

This section includes a summary of results from 2D computer simulations using the Poisson computer code. The cases considered are a dipole, with and without shielding, a quadrupole, sextupole, and gradient (dipole+quadrupole) with shielding.

Dipole Excitation without shield

Figure 10:
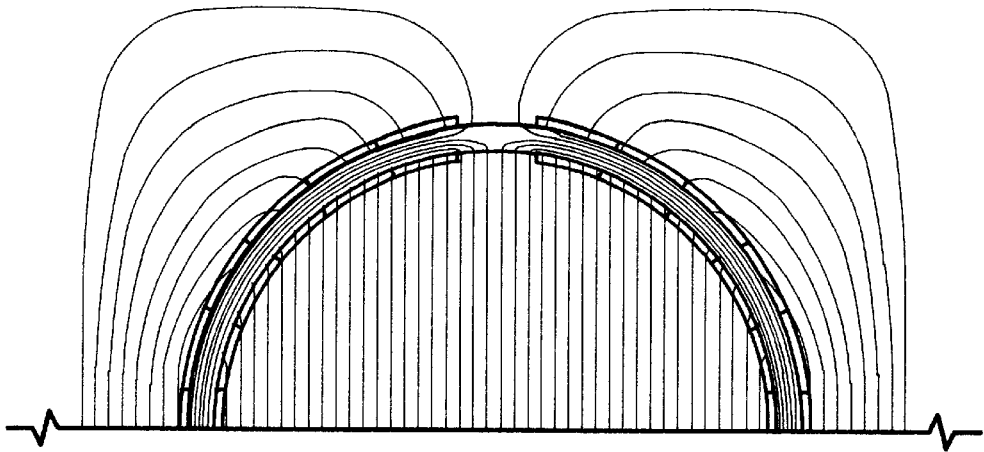
FIG. 10 illustrates the magnetic field lines in the exemplary implementation of FIG. 7 (without an outer shield) with the coils excited in accordance with the dipole mode.

FIG. 10 illustrates a top view corresponding to the embodiment of FIG. 7 in which the outer shield is not present, multipoles are tabulated as follows:

| n | $na_n/r$ | $nB_n/r$ | $|nc_n/r|$ |
|---|---|---|---|
| 1 | 2.0979E + 02 | 0.0000E + 00 | 2.0979E + 02 |
| 2 | −1.4638E − 03 | 0.0000E + 00 | 1.4638E − 03 |
| 3 | 4.3567E − 02 | 0.0000E + 00 | 4.3567E − 02 |
| 4 | −7.8383E − 04 | 0.0000E + 00 | 7.8383E − 04 |
| 5 | 1.1555E − 03 | 0.0000E + 00 | 1.1555E − 03 |

Dipole Excitation with Shield

Figure 11:
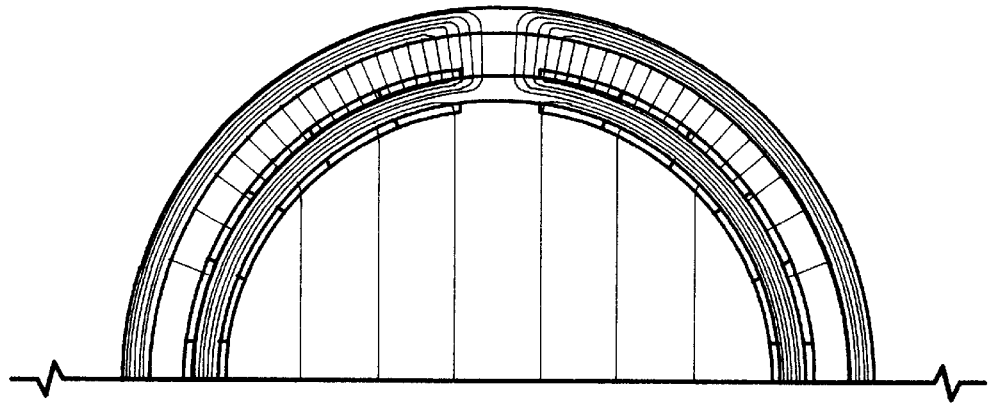
FIG. 11 illustrates the magnetic field lines in the exemplary implementation of FIG. 8 with the coils excited in accordance with the dipole mode.

FIG. 11 illustrates the embodiment of FIG. 8 with magnetic field lines obtained in the dipole mode of excitation under the following conditions:

$$I_0 = 1392 \text{ A } B_2 = 193 \text{ G}$$

Multipoles for a normalization radius r=15.0 cm are tabulated in accordance with $$B_x - iB_y = i\Sigma[n(a_n+ib_n)/r]\cdot(z/r)^{(n-1)}$$

as follows:

| n | $na_n/r$ | $nB_n/r$ | $|nc_n/r|$ |
|---|---|---|---|
| 1 | 1.9332E + 02 | 0.0000E + 00 | 1.9332E + 02 |
| 2 | −5.4497E − 03 | 0.0000E + 00 | 5.4497E − 03 |
| 3 | −1.6314E + 00 | 0.0000E + 00 | 1.6314E + 00 |
| 4 | −2.9388E − 03 | 0.0000E + 00 | 2.9388E − 03 |
| 5 | −1.4705E − 01 | 0.0000E + 00 | 1.4705E − 01 |

Quadrupole Excitation with Shield

Figure 12:
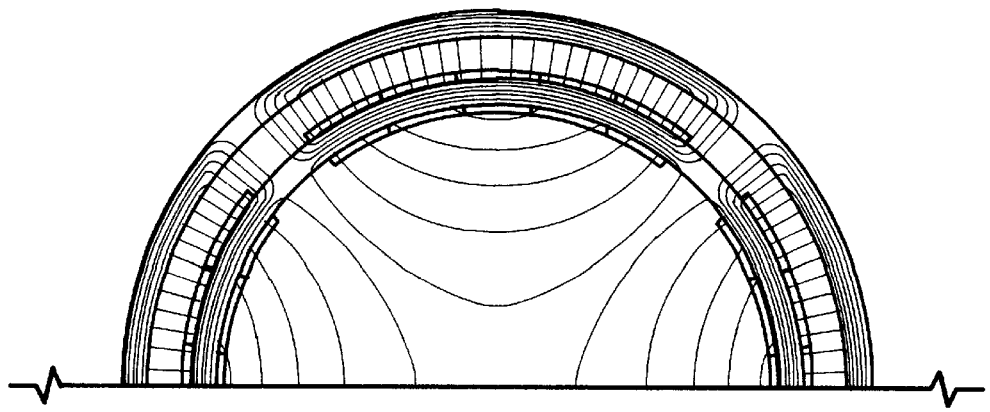
FIG. 12 illustrates the magnetic field lines in the exemplary implementation of FIG. 8 with the coils excited in accordance with the quadrupole mode.

FIG. 12 illustrates the embodiment of FIG. 7 (which lacks the outer shield) with magnetic field lines obtained under the sextapole mode of excitation under the following conditions:

$$I_0 = 1392 \text{ A } B_2 = 6.59 \text{ G/cm}$$

Multipoles for a normalization radius r=15.0 cm in accordance with $$B_x - iB_y = i\Sigma[n(a_n+ib_n)/r]\cdot(z/r)^{(n-1)}$$

are tabulated as follows:

| n | $na_n/r$ | $nB_n/r$ | $|nc_n/r|$ |
|---|---|---|---|
| 1 | −1.3637E − 03 | 0.0000E + 00 | 1.3637E − 03 |
| 2 | 9.8808E + 01 | 0.0000E + 00 | 9.8808E + 01 |
| 3 | −4.0090E − 04 | 0.0000E + 00 | 4.0090E − 04 |
| 4 | 3.6862E − 02 | 0.0000E + 00 | 3.6862E − 02 |
| 5 | −7.1417E − 05 | 0.0000E + 00 | 7.1417E − 05 |

Sextupole Excitation with Shield

Figure 13:
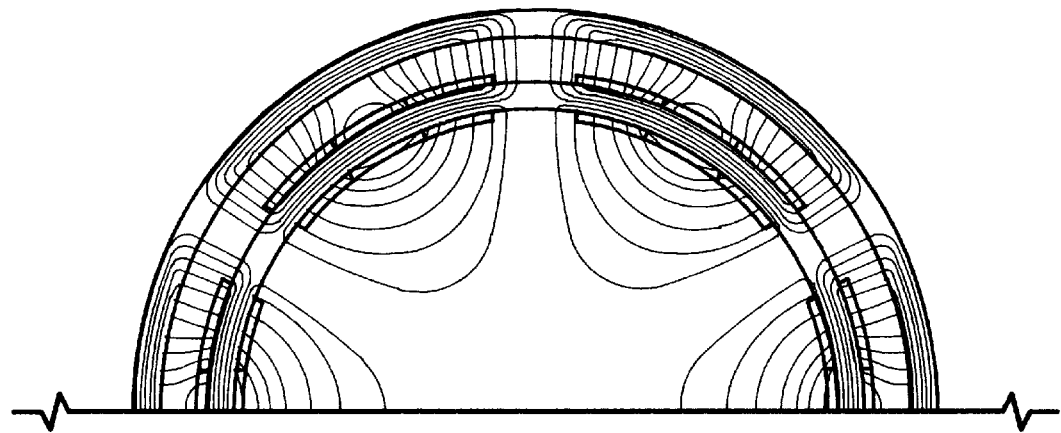
FIG. 13 illustrates the magnetic field lines in the exemplary implementation of FIG. 8 with the coils excited in accordance with the sextupole mode.

FIG. 13 illustrates the embodiment of FIG. 8 (having the outer shield) with magnetic field lines obtained under the sextapole mode of excitation under the following conditions:

$$I_0 = 490 \text{ A } B_3 = 16.4 \text{ G/cm}^2$$

Multipoles for a normalization radius r=15.0 cm in accordance with $$B_x - iB_y = i\Sigma[n(a_n+ib_n)/r]\cdot(z/r)^{(n-1)}$$

are tabulated as follows:

| n | $na_n/r$ | $nB_n/r$ | $|nc_n/r|$ |
|---|---|---|---|
| 1 | −3.4107E − 02 | 0.0000E + 00 | 3.4107E − 02 |
| 2 | 8.3389E − 02 | 0.0000E + 00 | 8.3389E − 02 |
| 3 | 1.6411E + 01 | 0.0000E + 00 | 1.6411E + 01 |
| 4 | 1.1922E − 02 | 0.0000E + 00 | 1.1922E − 02 |
| 5 | −1.7778E − 02 | 0.0000E + 00 | 1.7778E − 02 |

Dipole-Quadrupole Excitation with Shield

Figure 14:
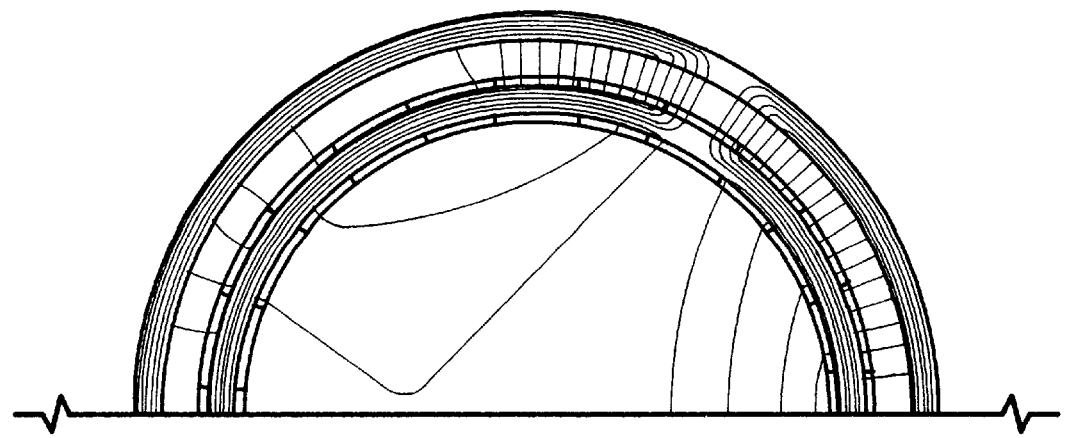
FIG. 14 illustrates the magnetic field lines in the exemplary implementation of FIG. 8 with the coils excited in accordance with a combination of dipole and quadrupole modes.

FIG. 14 illustrates the embodiment of FIG. 8 with magnetic field lines obtained under excitation of a combination of the dipole and quadrupole modes under the following conditions:

$$I_0 = I_{0_1} + I_{0_2} = 653 + 1360 = 1960 \text{ A}, M=24, B_1=94 \text{ G}, B_2=185 \text{ G}$$

Multipoles for a normalization radius r=15.0 cm in accordance with $$B_x - iB_y = i\Sigma[n(a_n+ib_n)/r]\cdot(z/r)^{(n-1)}$$

are tabulated as follows:

| n | $na_n/r$ | $nb_n/r$ | $|nc_n/r|$ |
|---|---|---|---|
| 1 | −9.4282E + 01 | 0.0000E + 00 | 9.4282E + 01 |
| 2 | −9.2549E + 01 | 0.0000E + 00 | 9.2549E + 01 |
| 3 | −1.6282E − 01 | 0.0000E + 00 | 1.6282E − 01 |
| 4 | −3.7533E − 02 | 0.0000E + 00 | 3.7533E − 02 |
| 5 | −2.7627E − 02 | 0.0000E + 00 | 2.7627E − 02 |

Three Dimensional Analysis and Refinement of Computations of Design Parameters The foregoing 2-dimensional analysis provides a very good approximation for a magnet with a long axial extent commercial pared to cross sectional dimensions. Even for a relatively short magnet, a 2-dimensional model is very useful in gaining qualitative understanding to aid in the design and optimization. Consideration of 3-dimensional effects is usually necessary in the final stage of the design. The 3-dimensional analysis of the effects due to the finite length of the plasma etch magnet will now be given. Two end effects are analyzed: (1) on-axis field decay and (2) induced perturbations in the ideal field distribution. We introduce a change in notation in the following discussion: the three Cartesian coordinates are represented by x, y, and z. It should be noted that in the foregoing 2-dimensional analysis the term "z" was used as the complex variable z≡x+iy, but in the following description z is used for a different purpose, namely as the third dimension of the Cartesian coordinate system. Therefore, we now instead use ζ≡x+iy to represent the complex variable in the following analysis.

1. On-Axis Field Decay Due to Finite Axial Length

Figure 15A:
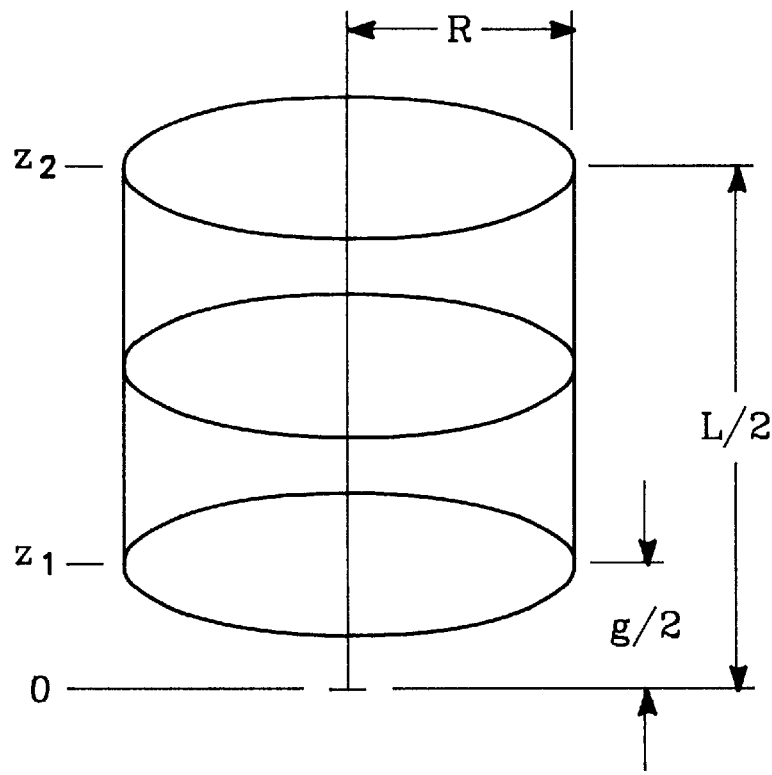
FIG. 15A illustrates a split magnetic ring geometry of the magnet of the exemplary implementation for consideration in a 3-dimensional design analysis.
Figure 15B:
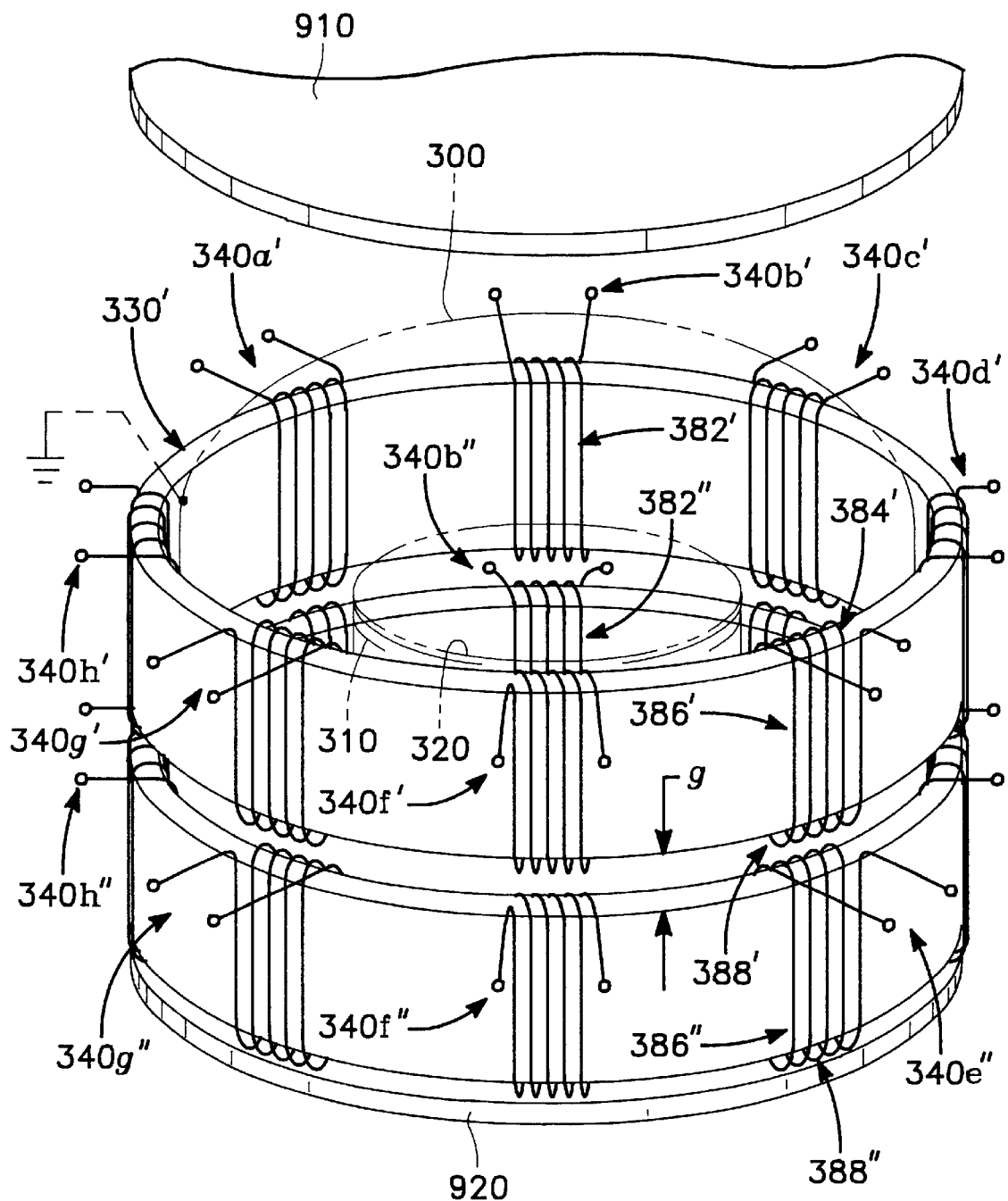
FIG. 15B is a detailed perspective view of the split magnetic ring geometry of FIG. 15A showing the gap between the yoke halves providing wafer ingress and egress.

Consider the solenoid model illustrated in FIG. 15A, which shows the upper half of a split solenoid magnet to total length L and gap g separating the halves. FIG. 15B illustrates a preferred reactor corresponding to the model of FIG. 15A. In FIG. 15B, the magnetic ring or yoke 330 is axially split into two halves 330', 330'', each having an identical arrangement of windings, namely the windings 340a'–340h' on the upper yoke half 330' and windings 340a"–340h" on the lower yoke half 330". The winding locations correspond in a general way to that illustrated in FIG. 3. Current is uniform along the length and is distributed in the azimuthal direction in a thin sheet at radius R. For a split solenoid the on-axis field at z=0 for arbitrary cylinder pair height L and gap g is derived as follows:

$$B_z(0) = \int_{z_1}^{z_2} \frac{\mu_0 I' R^2}{2(R^2+z^2)^{3/2}} dz \quad (31)$$

where z=R tan θ, dz=R sec² θdθ, yielding $$B_z(0) = \frac{\mu_0 I'}{2} \sin\theta \Big|_{\theta_1}^{\theta_2} = \frac{\mu_0 I'}{2} \left[ \frac{z_2}{(z_2^2+R^2)^{1/2}} - \frac{z_1}{(z_1^2+R^2)^{1/2}} \right]$$

Normalizing by the on-axis field of an infinitely long solenoid (i.e., the 2D case), we have (with $\hat{z}_2 \equiv z_2/R$, etc.):

$$\hat{B}_z \equiv \frac{B_z(0)}{B_z(0)|_{z_2 \to \infty, z_1 \to 0}} = \quad (32)$$

$$\frac{\hat{z}_2}{(\hat{z}_2^2+1)^{\frac{1}{2}}} - \frac{\hat{z}_1}{(\hat{z}_1^2+1)^{\frac{1}{2}}} = \sqrt{\frac{\hat{L}^2}{\hat{L}^2+4}} - \sqrt{\frac{\hat{g}^2}{\hat{g}^2+4}}$$

where $2z_2=L$ and $2z_1=g$ for a split ring design. The on-axis field near the end of a lone solenoid is just half that of the split solenoid value.

Figure 16:
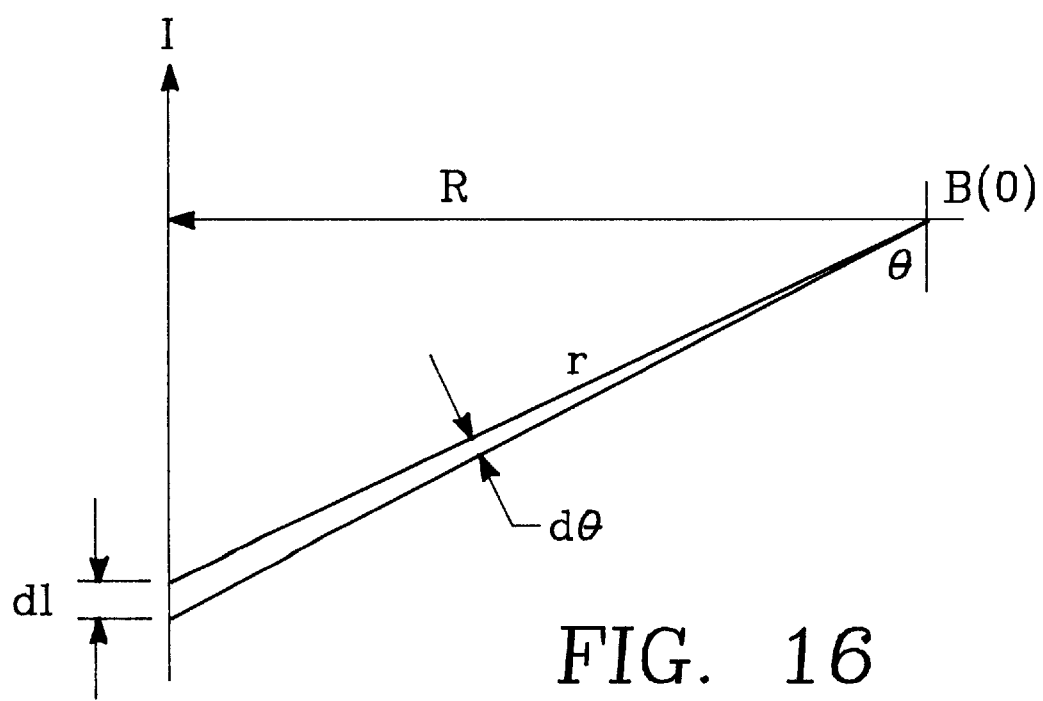
FIG. 16 is a diagram illustrating the geometry of a current filament employing the 3-dimensional design analysis.

Analogously, FIG. 16 shows a current filament segment of length L aligned parallel to the z-axis. The on-axis field at z=0 for arbitrary segment length L, with a gap g in the center of the segment is derived as follows:

$$B_y(0) = \int_{\theta_1}^{\theta_2} \frac{\mu_0 I}{4\pi r^2} \sin\theta dl \quad (33)$$

where sin θdl=rdθ, R=r sin θ, yielding $$B_y(0) = \frac{\mu_0 I}{4\pi} \int_{\theta_1}^{\theta_2} \frac{\sin\theta}{R} d\theta = \frac{\mu_0 I}{4\pi R}(\cos\theta_1 - \cos\theta_2)$$

Normalizing to the field near an infinite length axial filament, the field at any point in the midplane in the vicinity of a split current filament segment is $$\hat{B}_y \equiv \frac{B_y(0)}{B_y(0)|_{\theta_2 = \frac{\pi}{2}, \theta_1 = 0}} = (\cos\theta_1 - \cos\theta_2) = \sqrt{\frac{\hat{L}^2}{\hat{L}^2+4}} - \sqrt{\frac{\hat{g}^2}{\hat{g}^2+4}} \quad (34)$$

The on-axis field near the end of a lone current filament segment is half that of the split current filament segment value. Note that the equations for the normalized 3-dimensional on-axis field for a solenoid and for an axial current filament are identical.

Table 1 summarizes the on-axis field loss at the center

TABLE 1

Central Field Fall-off as a Function of Magnet Height

| $\hat{L} \equiv L/R$ | $\hat{B} \equiv B/B\|_{L \to \infty}$ |
|---|---|
| 3.0 | 0.83 |
| 2.4 | 0.77 |
| 2.0 | 0.71 |
| 1.6 | 0.62 |
| 1.2 | 0.51 |
| 1.0 | 0.45 |
| 0.8 | 0.37 |
| 0.6 | 0.29 |
| 0.4 | 0.20 |
| 0.3 | 0.15 |
| 0.2 | 0.10 |
| 0.1 | 0.05 |
| δ | δ/2 | of a finite length magnet of aspect ratio $\hat{L} \equiv L/R$. On-axis field loss at the center of a split magnet can be determined by using Table 1 a second time, substituting L with g, then taking the difference. The on-axis field loss near the end of a lone contiguous magnet can be determined by halving that value.

In case 1, the uniform iB*=100 G, with L=44 cm, and g=6 cm. Then $\hat{B}$=0.492 (=0.592−0.100) and the corresponding 2D field iB*$_{2D}$=203 G. The required 1$^{st}$ quadrant amperage $\hat{I}_0$=4852 A, and the maximum filament current $I_0$=1271 A are increased by a factor of 2.03 (=1/0.492) over the values given after Eq. 15. The required shielding package thickness f=9.01 (neglecting the $t_{tf}$=0.17 cm portion), an increase of a factor $\sqrt{2.03}$ over the value computed above using 2-dimensional analysis.

In case 2, with 0–100 G gradient field, with the same split geometry, then iB*$_{max}$=150 G at $r_q$=30 cm. This corresponds to a 2D field with $B_{1_{2D}}$=101.5 G, and $B_{2_{2D}}$=203 G. The required amperage over π/2, $\hat{I}_0 \equiv \hat{I}_{0_1} + 2\hat{I}_{0_2}$=2426+2·2426=7278 A, and the maximum filament current $\hat{I}_0 \equiv I_{0_1} + I_{0_2}$=635+1270=1905 A. These values are 50% larger than for case 1. The required shielding package thickness f=7.80 cm is $\sqrt{1.5/2.0}$ times that for case 1.

Figure 17:
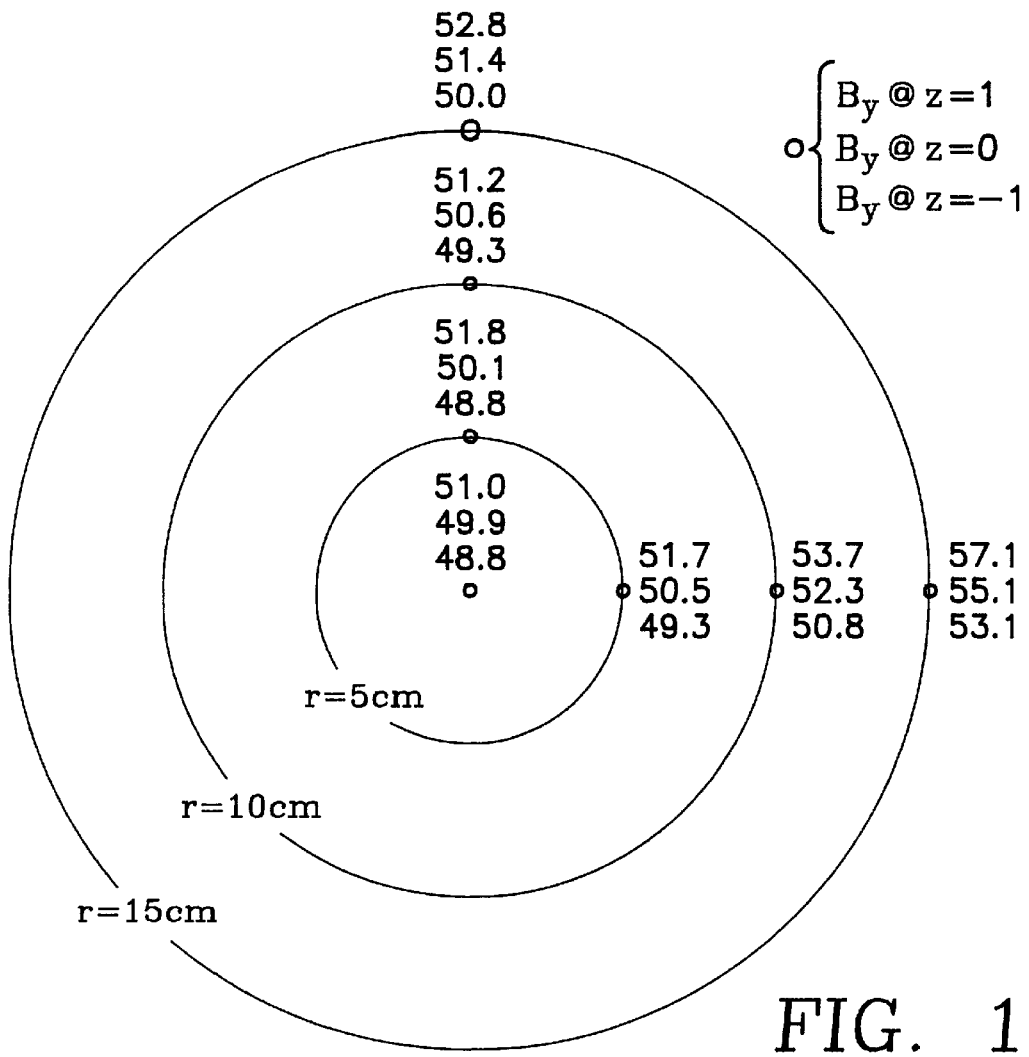
FIG. 17 is a graph of y-component magnetic field values (in Gauss) obtained in the upper magnet half of the exemplary implementation.

2. Three-Dimensional Field Distribution Summary of Exemplary Implementation Design Results The three-dimensional nature of the magnet gives rise to a deviation from the ideal field distribution in any plane perpendicular to the axis of the magnet. The results of calculations using the theory presented to be presented below are now summarized. For the example with parameters M=24 filaments adjacent to a surrounding yoke in a split magnet design with L=44 cm, g=6 cm, current connector thickness th=4.8 cm, chamber radius $R_c$=30 cm, and maximum current $I_0$=1271 A (=>iB*$_{2D}$=203 G, so as to give iB*=100 G on the midplane of our 3D geometry), the analytically calculated y-component of the field $B_y$(r, θ, z) is shown in FIG. 17, at radii r=0, 5, 10, 15 cm, θ=0, 90° and z=−1, 0, 1 cm. For these parameters, which are roughly those of the exemplary implementation, the maximum variation of $B_y$ over the radius $|z| \leq 15$ is 10.4%. Over the azimuth the maximum variation is 7.4%, and over the axial direction for $|z| \leq 1$ the maximum variation is 4.4%. The radial variation can be reduced to 6.7% by using 16% additional amperage to create a sextupole term (N=3) per Eq. 15. This capability may also be useful to correct radial plasma etch nonuniformities in the chamber.

The results are summarized in FIG. 17 showing circles at radii of 5, 10, 15 cm. Points are shown at the center and at 0° and 90° on the circles. At each point $B_y$ field values are given for z=1, z=0, and z=−1. At all locations over the region $|r| \leq 15$ cm, $|z| \leq 1$ cm, $B_x \leq 0.04 B_y$ and $B_z \leq 0.002 B_y$.

3D Closed Form Expression Derivation

Figure 18:
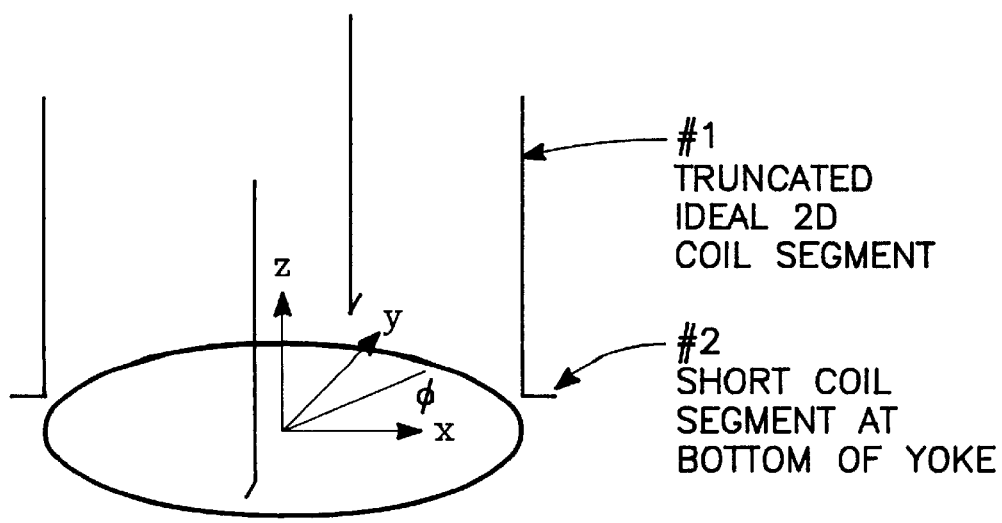
FIG. 18 is a diagram illustrating pertinent current-source segments in the 3-dimensional geometry of the top half of the split magnetic ring of the exemplary embodiment.

FIG. 18 illustrates the model for calculating field distributions due to 3D features of the geometry. There are two essential features that contribute to the field in the region of interest in the chamber: the truncated ideal 2D coil segment, which gives rise to $\vec{B}_1$ and, the short horizontal coil segment near the chamber midplane, which gives rise to $\vec{B}_2$. The filament return on the outside of the annular iron yoke and the short horizontal segment at the opposite extreme of the magnet do not contribute to the field in the chamber, as they are shielded by the yoke. We consider the two contribution sources above separately, and use the half-magnet geometry above the midplane.

Figure 19:
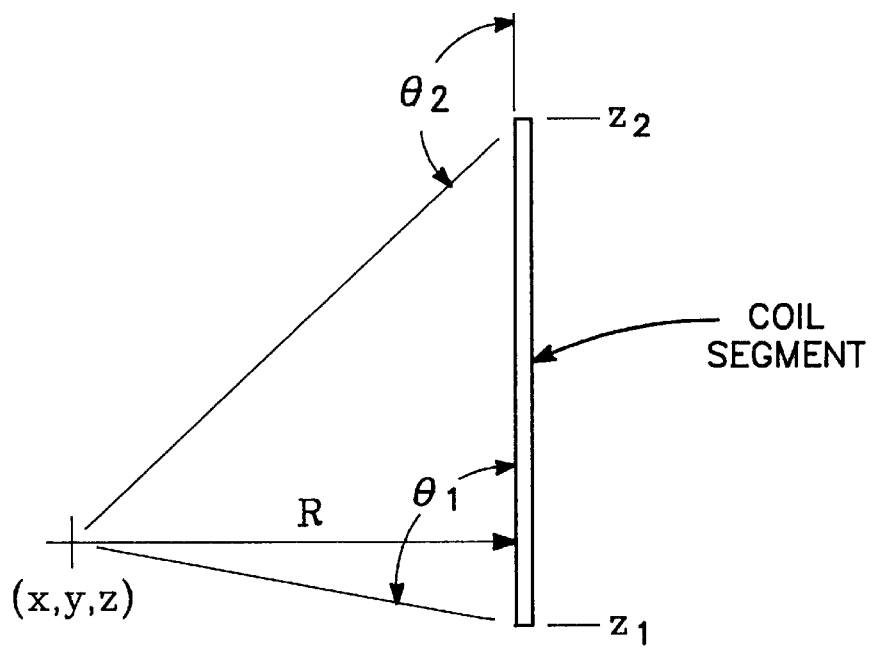
FIG. 19 is a diagram of the 3-dimensional geometry of a truncated interior coil filament of the exemplary embodiment.

The geometry of a truncated 2D coil segment is shown in FIG. 19. For the M vertical segments we have:

$$|B| = \int_{\theta_1}^{\theta_2} \frac{\mu_0 I}{4\pi r} d\theta = \int_{\theta_1}^{\theta_2} \frac{\mu_0 I}{4\pi R} \sin\theta d\theta \quad (35)$$

yielding, $$|B| = \frac{\mu_0 I}{4\pi R}\left[\frac{\Delta z_1}{(\Delta z_1^2 + R^2)^{1/2}} - \frac{\Delta z_2}{(\Delta z_2^2 + R^2)^{1/2}}\right], \quad (36)$$

where $\Delta z_1 \equiv z_1 - z$, $\Delta z_2 \equiv z_2 - z$.

For a dipole with M coils with current $$I_m = I_0 \cos \alpha_m;\ 0 \leq m \leq M-1;\ \alpha_m \equiv 2\pi m/M; \quad (37)$$

$$I_0 = (B_{2D} 2\pi R_c \cdot 2)/(\mu_0 M) \quad (38)$$

$B_{2D}$ is the desired 2D dipole field and $I_0$ is twice the actual coil current if an iron ring is present.

$$\vec{B}(x,y,z) = \sum_{m=0}^{M-1} \vec{B}_m(x,y,z);\ \vec{B}_m = |B_m|(\sin\varphi_{mz}, -\cos\varphi_{mz}, 0) \quad (39)$$

where $\phi_{mz} = \arctan(y_m - y/x_m - x)$; $x_m + i y_m = R_c e^{i\alpha_m}$; $R_c$ is the coil radius, and $$|B_m| = \frac{\mu_0 I_m}{4\pi R_{mz}}\left[\frac{\Delta z_1}{(\Delta z_1^2 + R_{mz}^2)^{1/2}} - \frac{\Delta z_2}{(\Delta z_2^2 + R_{mz}^2)^{1/2}}\right] \quad (40)$$

where $R_{mz} = [(x - x_m)^2 + (y - y_m)^2]^{1/2}$.

The parameters $z_1$ and $z_2$ are the given lower and upper axial coordinates of coil #1, as illustrated in FIG. 19.

Figure 20:
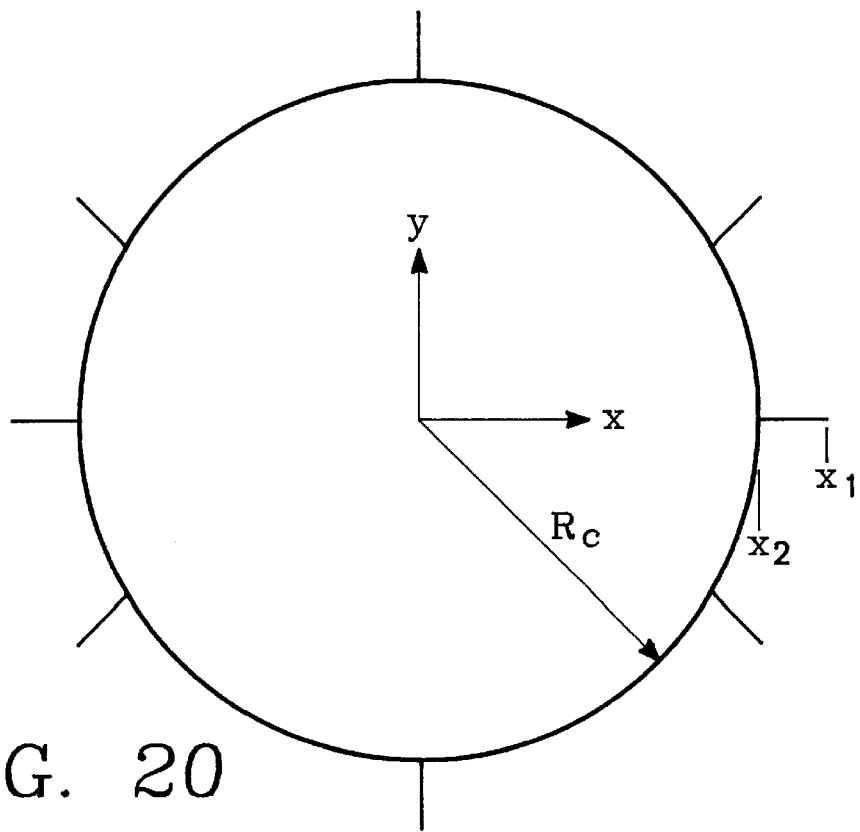
FIG. 20 is a diagram of the geometry of a short horizontal coil segment in the exemplary embodiment near the chamber midplane.

FIG. 20 illustrates the geometry for the short horizontal coil segments near the chamber midplane. For M horizontal segments, starting with the segment at the azimuth along the positive x axis, we have:

$$\vec{B}(x,y,z) = \frac{\mu_0 I_m}{4\pi R_x}\left[\frac{x_1 - x}{[(x_1-x)^2 + R_x^2]^{1/2}} - \frac{x_2 - x}{[(x_2-x)^2 + R_x^2]^{1/2}}\right] \quad (41)$$

where $R_x = [(y-0)^2 + (z-z_1)^2]^{1/2}$; $x_1 = R_c + th$, $x_2 = R_c$

Therefore, for the general coil segment at $\alpha_m$ we can rotate $(x+iy) \equiv \varsigma$ by $e^{-i\alpha_m} \to (x', y')$:

$$\vec{B}(x,y,z) = \sum_{m=1}^{M} \vec{B}_m(x,y,z); \quad (42)$$

where $\vec{B}_m = |B_m|(-\sin\alpha_m \sin\phi_{x'}, \cos\alpha_m \sin\phi_{x'}, -\cos\phi_{x'})$;

$\phi_{x'} = \arctan\left(\frac{z_1 - z}{0 - \text{Im}\{\varsigma e^{-i\alpha_m}\}}\right)$;

$\varsigma \equiv x + iy$;

$\alpha_m \equiv 2\pi m/M$;

$|B_m| = \frac{\mu_0 I_m}{4\pi R_{mx}}\left[\frac{\Delta x_{1m}}{[\Delta x_{1m}^2 + R_{mx}^2]^{1/2}} - \frac{\Delta x_{2m}}{[\Delta x_{2m}^2 + R_{mx}^2]^{1/2}}\right]$;

$\Delta x_{1m} = x_1 - x'_m = R_c + th - \text{Re}\{\varsigma e^{-i\alpha_m}\}$ $\Delta x_{2m} = x_2 - x'_m = R_c - \text{Re}\{\varsigma e^{-i\alpha_m}\}$;

$R_{mx} = [(\text{Im}\{\varsigma e^{-i\alpha_m}\} - 0)^2 + (z-z_1)^2]^{1/2}$;

$I_m = I_0 \cos\alpha_m;\ I_0 = \frac{B_{2D} \cdot 2\pi R_c \cdot 2}{\mu_0 M}$

Note that this will actually overestimate the contribution from these short return leads, since it effectively assumes a mirror sheet of infinite extent at $z=z_1$.

The above expressions are developed for the top half of the split geometry. If the wafer plane corresponds to the symmetric midplane, the top half and bottom half coil segments contribute equally, and, therefore, for this case, the result obtained from these expressions must simply be doubled. To calculate fields off the midplane by invoking symmetry to superimpose fields for $\vec{B}(x, y, z=\delta)$ and $\vec{B}(x, y, z=-\delta)$.

Equations for 3D Computer Code

The multiple output terminal current source of FIG. 3A may be enhanced with a computer (not shown) having a monitor and keyboard or mouse. The computer can control the current distribution among the plural windings. Using the equations described below, a computer code can be programmed as a software package stored in the computer which computes the 3-dimensional magnetic field generated inside the chamber by the electromagnet for any given selection (by a user) of a particular current distribution among the plural windings. The 3-dimensional magnetic field can then be shown to the user on the video display. The image can be derived using standard graphic imaging tools from the 3-dimensional magnetic field thus computed. The user may then modify his/her selection of current distribution among the plural windings.

The following defines equations used in the computer code of our 3-D computer simulation of the exemplary embodiment, beginning with the definitions of the key parameters. Such a computer code may be employed to implement intelligent control within the multiple output current generator 372 of FIG. 3 to permit a user to intelligently sculpt a desired magnetic field configuration inside the reactor chamber.

Constants: $\mu_0 = 0.4\,\pi$ G-cm/A

Parameters: M, $R_c$, $z_1$, $z_2$, th, $B_{2D}$, r, z

General: For r, $\theta$ calculate $I_0 = B_{2D}4\pi R_c/\mu_0 M$ for $\zeta = x + iy = re^{i\alpha_m}$, $\alpha_m = 2\pi(m-1)/M$, $1 \leq m \leq M$ Equations for Coil #1—truncated vertical coil segments:

$$\zeta_m \equiv x_m + iy_m \equiv R_c e^{i\alpha_m}$$

$$\phi_{mz} = \arctan\left(\frac{y_m - y}{x_m - x}\right)$$

$$R_{mz} = [(x_m - x)^2 + (y_m - y)^2]^{1/2}$$

$$\Delta z_1 \equiv z_1 - z,\; \Delta z_2 \equiv z_2 - z(\,= \Delta z_1 + z_2 - z_1)$$

$$I_m = I_{0_N}\cos\alpha_m N$$

$$|B_m|_1 = \frac{\mu_0 I_m}{4\pi R_{mz}}\left[\frac{\Delta z_1}{(\Delta z_1^2 + R_{mz}^2)^{1/2}} - \frac{\Delta z_2}{(\Delta z_2^2 + R_{mz}^2)^{1/2}}\right]$$

$$\vec{B}_{m1} = |B_m|_1(\sin\phi_{mz}, -\cos\phi_{mz}, 0)$$

$$\vec{B}_1(x, y, z) = \sum_{m=1}^{M} \vec{B}_{m1}$$

Equations for Coil #2—short horizontal coil segments:

$$\phi_{x'} = \arctan\left(\frac{z_1 - z}{0 - \text{Im}\{\zeta e^{-\alpha_m}\}}\right)$$

$$R_{mx'} = [(\text{Im}\{\zeta e^{-\alpha_m}\} - 0)^2 + (z - z_1)^2]^{1/2}$$

$$\Delta x_{1m} \equiv x_1 - x_{m'} = R_c + th - \text{Re}\{\zeta e^{-\alpha_m}\}$$

$$\Delta x_{2m} \equiv x_2 - x_{m'} = R_c - \text{Re}\{\zeta e^{-i\alpha_m}\}(\,= \Delta x_{1m} + x_2 - x_1 = \Delta x_{1m} - th)$$

$$|B_m|_2 = \frac{\mu_0 I_m}{4\pi R_{mx}}\left[\frac{\Delta x_{1m}}{(\Delta x_{1m}^2 + R_{mx}^2)^{1/2}} - \frac{\Delta x_{2m}}{(\Delta x_{2m}^2 + R_{mx}^2)^{1/2}}\right]$$

$$\vec{B}_{m2} = |B_m|_2(-\sin\alpha_m\sin\phi_{x'}, \cos\alpha_m\sin\phi_{x'}, -\cos\phi_{x'})$$

$$\vec{B}_2(x, y, z) = \sum_{m=1}^{M} \vec{B}_{m2}$$

Full field:

$$\vec{B}(x, y, z) = \vec{B}_1 + \vec{B}_2$$

Figure 1A:
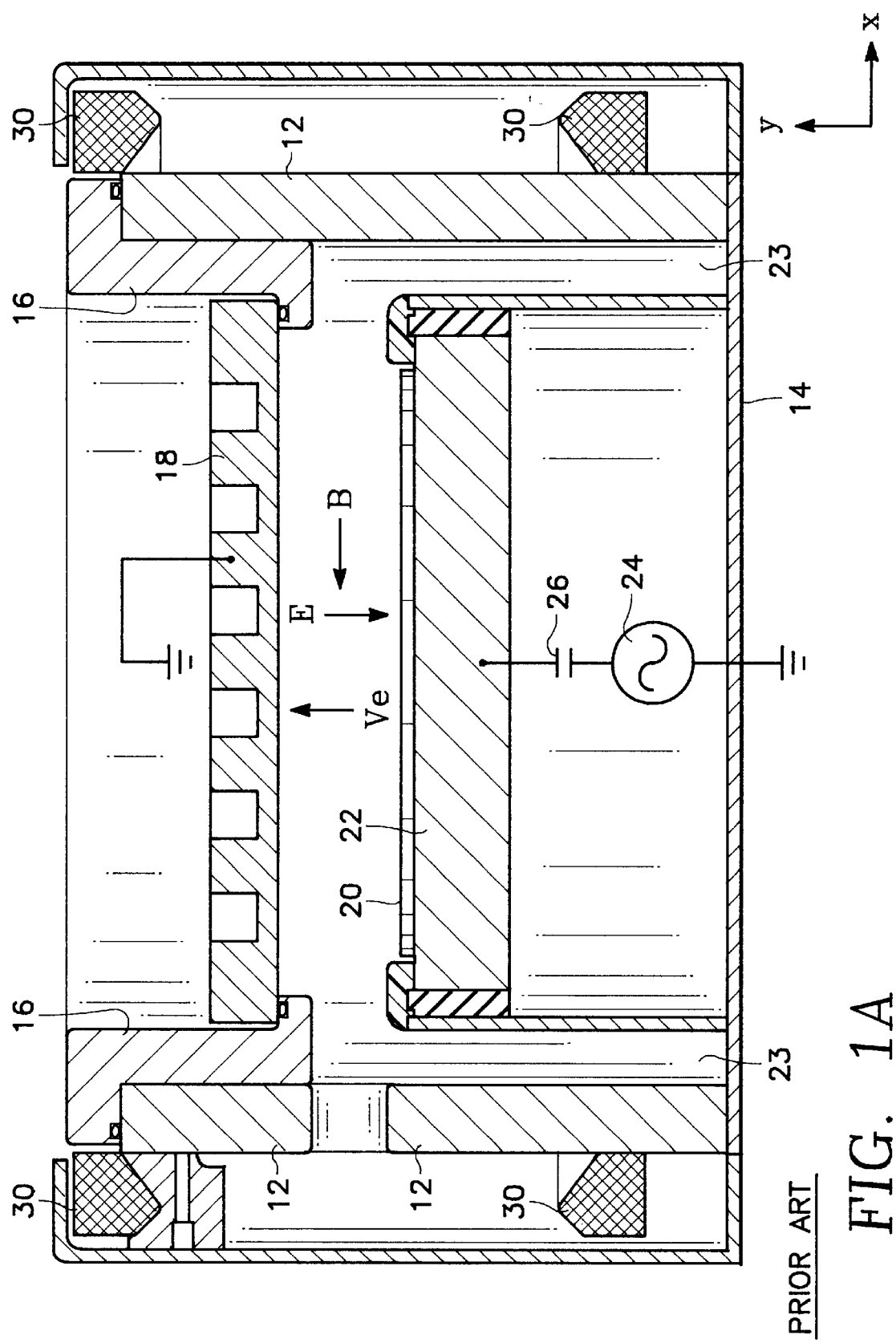
FIG. 1A is a schematic longitudinal sectional view of a magnetically-enhanced plasma chamber.
Figure 1B:
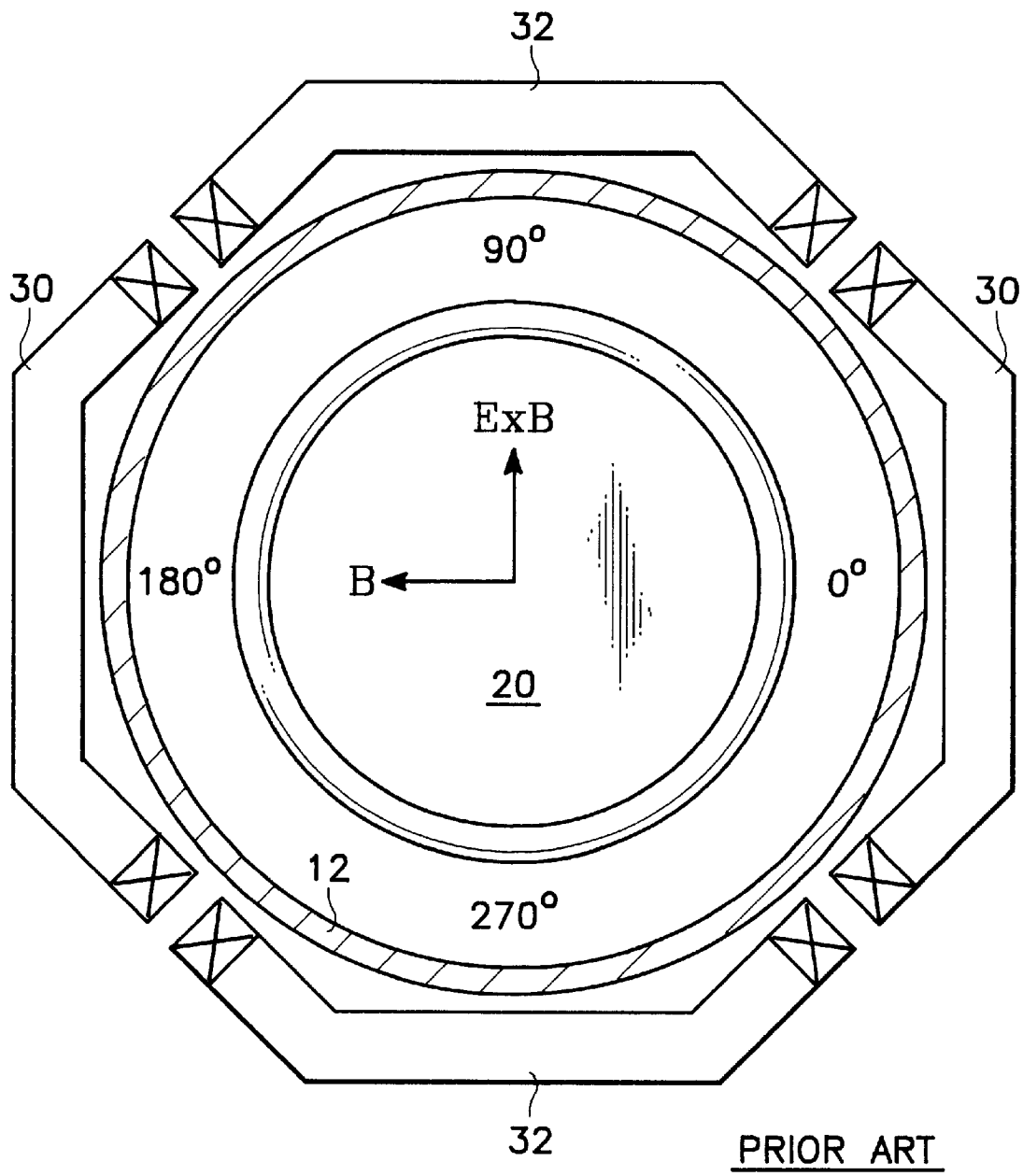
FIG. 1B is a schematic top view of the magnetically-enhanced plasma chamber of FIG. 1A.
Figure 2A:
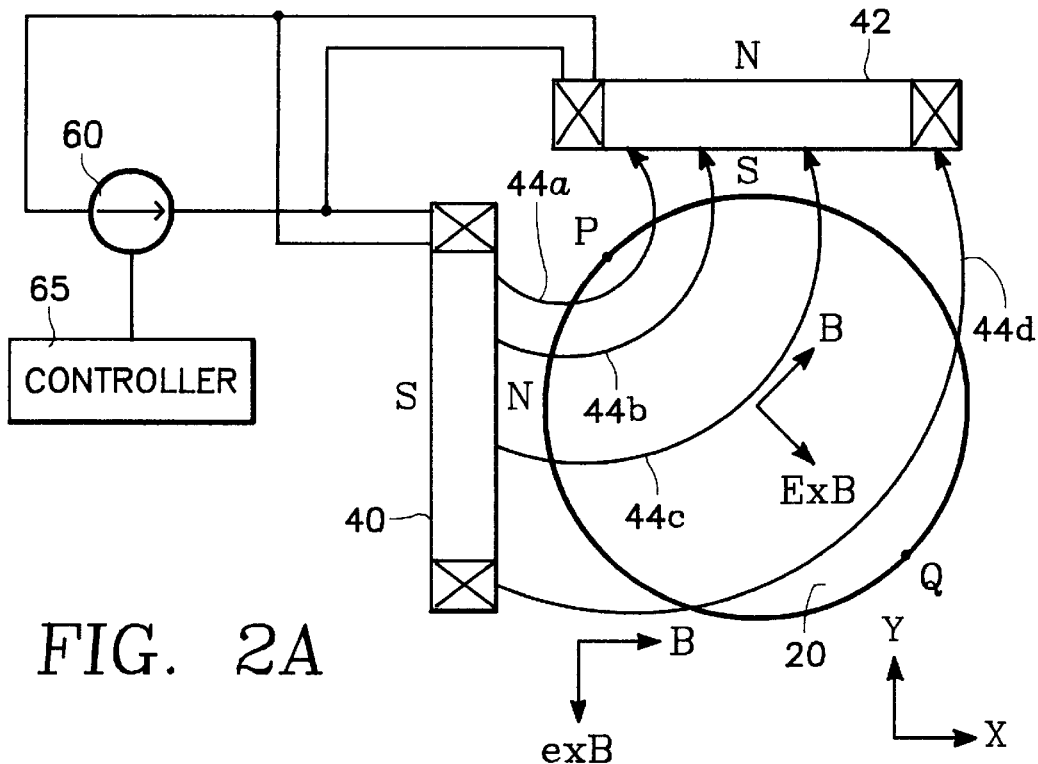
FIG. 2A is a schematic top view of a magnetically enhanced plasma reactor chamber employing one pair of orthogonal coils.
Figure 2B:
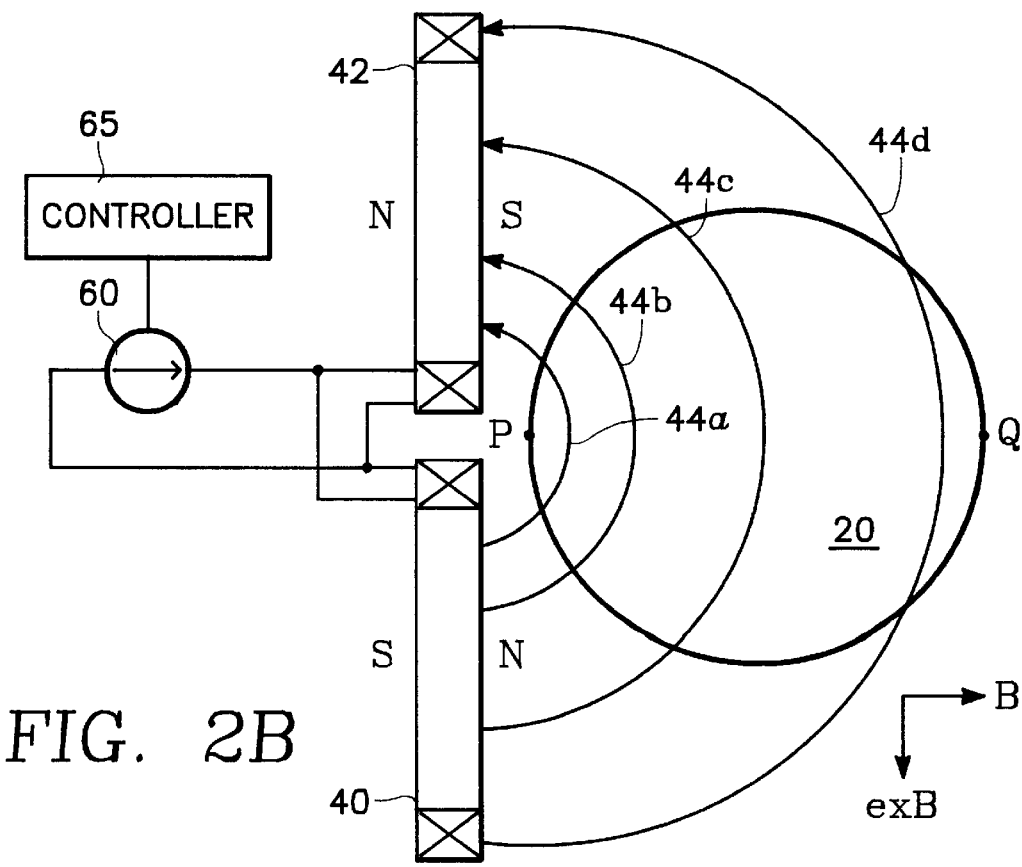
FIG. 2B illustrates a modification of the chamber of FIG. 2A in which the pair of coils are oriented at 180 degrees to one another.

One of the modes of operation described above combined both dipole and quadrupole magnetic fields, and is illustrated in FIG. 14. Preferably, the magnetic field gradient provided by the quadrupole component of this mode of operation is adjusted to precisely offset the E×B effect on plasma ion distribution across the wafer surface described above in detail with reference to FIGS. 1A and 1B.

While the invention has been described with reference to a preferred embodiment in which the yoke is cylindrical, the yoke could be a polygon (consisting of a series of flat yoke segments or plates), with a separate coil winding wound around each straight segment of the polygonal yoke.

The preferred embodiment of the invention has two axially offset cylindrical yokes with respective sets of coil windings wound thereabout, the gap separating the yokes providing ingress and egress for the wafer. While the two sets of plural coil windings can be driven with different current patterns, it is preferable that they be driven in accordance with the same current pattern. For this purpose, a winding on one of the axially offset yokes in the same azimuthal position as a winding on the other yoke is driven with the same current source, so that the two windings are best connected in series.

While the invention has been described in detail by specific reference to preferred embodiments, it is understood that variations and modifications thereof may be made without departing from the true spirit and scope of the invention.

What is claimed is:

1. A magnetically enhanced plasma reactor for processing a semiconductor workpiece, comprising:

a reactor enclosure defining a vacuum chamber;

a wafer support for holding said workpiece inside said chamber;

a plasma power source for applying plasma source power into said chamber;

a first plurality of electrically conductive elongate filaments, each being of a finite length, distributed about a periphery of said chamber enclosure, each of said filaments extending at least generally in an axial direction relative to said chamber; and said plurality of filaments being capable of permitting different currents through different ones of at least some of said filaments in accordance with a distribution of currents among said filaments corresponding to a desired magnetic field configuration.

2. The apparatus of claim 1 further comprising:

respective current sources connected to deliver respective currents to different ones of said plurality of filaments.

3. The apparatus of claim 2 wherein said respective current sources apply different currents to different ones of said filaments in accordance with said distribution of currents among said filaments corresponding to said desired magnetic field configuration.

4. The apparatus of claim 1 wherein said filaments are generally mutually parallel.

5. The apparatus of claim 4 wherein the currents flowing through adjacent ones of said plural filaments are in the same direction.

6. The apparatus of claim 5 wherein said workpiece is generally planar and said filaments extend generally perpendicular with respect to said planar workpiece.

7. The apparatus of claim 6 wherein said filaments are arranged generally in a circle and extend perpendicularly to the plane of said circle.

8. The apparatus of claim 1 wherein said respective current sources provide respective currents to respective groups of said filaments in accordance with said distribution of currents among said respective groups corresponding to said desired magnetic field configuration.

9. The apparatus of claim 8 wherein:

said filaments are distributed generally in a cylinder about said enclosure and extend axially with respect to said cylinder;

said distribution of currents is in accordance with a periodic pattern around said cylinder.

10. The apparatus of claim 9 wherein said periodic pattern is sinusoidal in N$\theta$, where $\theta$ is an angle of azimuth about said cylinder and 2N corresponds to a number of magnetic poles in said desired magnetic field configuration.

11. The apparatus of claim 1 further comprising:

a second plurality of electrically conductive elongate filaments, each being of a finite length, distributed about a periphery of said chamber enclosure, each of said second plurality of filaments extending at least generally in an axial direction relative to said chamber;

said second plurality of filaments being parallel to and axially displaced from said first plurality of filaments by a gap providing ingress and egress of said workpiece in said chamber;

said second plurality of filaments being capable of permitting different currents through different ones of at least some of said second plurality of filaments in accordance with a distribution of currents among said filaments corresponding to a desired magnetic field configuration.

12. A magnetically enhanced plasma reactor for processing a semiconductor workpiece, comprising:

a reactor enclosure defining a vacuum chamber;

a wafer support for holding said workpiece inside said chamber;

a plasma power source for applying plasma source power into said chamber;

a first plurality of electrically conductive coil windings distributed about a periphery of said chamber enclosure, said coil windings extending at least generally in an axial direction relative to said chamber;

respective magnetically permeable yoke segments around which respective ones of said coil windings are wound;

said plurality of coil windings being capable of permitting different currents through different ones of said coil windings in accordance with a distribution of currents among said coil windings corresponding to a desired magnetic field configuration.

13. The apparatus of claim 12 further comprising:

respective current sources connected to deliver respective currents to different ones of said plurality of coil windings in accordance with said distribution of currents.

14. The apparatus of claim 12 wherein said plurality of yoke segments form a yoke surrounding said chamber.

15. The apparatus of claim 13 wherein said respective current sources apply different currents to different ones of said coil windings in accordance with said distribution of currents among said coil windings corresponding to said desired magnetic field configuration.

16. The apparatus of claim 12 wherein each of said coil windings comprises an interior filament on a side of the corresponding yoke segment facing said chamber and a exterior return filament on an opposite side of the corresponding yoke segment, and wherein said yoke segment has sufficient magnetic permeability to effectively shield said chamber from magnetic fields generated by said return filaments.

17. The apparatus of claim 16 wherein said filaments are generally mutually parallel.

18. The apparatus of claim 17 wherein the currents flowing through adjacent ones of said filaments are in the same direction on the interior side of said yoke segments.

19. The apparatus of claim 17 wherein said workpiece is generally planar and said filaments extend generally perpendicular with respect to said planar workpiece.

20. The apparatus of claim 16 wherein said filaments are arranged generally in a circle and extend perpendicularly to the plane of said circle.

21. The apparatus of claim 16 wherein:

said filaments are distributed generally in a cylinder about said enclosure and extend axially with respect to said cylinder;

said distribution of currents is in accordance with a periodic pattern around said cylinder.

22. The apparatus of claim 21 wherein said periodic pattern is sinusoidal in $N\theta$, where $\theta$ is an angle of azimuth about said cylinder and 2N corresponds to a number of magnetic poles in said desired magnetic field configuration.

23. The apparatus of claim 22 wherein said periodic pattern comprises a superposition of respective patterns sinusoidal in $N\theta$ for respective values of N.

24. The apparatus of claim 12 further comprising:

a second plurality of coil windings distributed about a periphery of said chamber enclosure, each of said second plurality of coil windings extending at least generally in an axial direction relative to said chamber;

said second plurality of coil windings being parallel to and axially displaced from said first plurality of coil windings by a gap providing ingress and egress of said workpiece in said chamber;

said second plurality of coil windings being capable of permitting different currents through different ones of said second plurality of coil windings in accordance with a distribution of currents among said coil windings corresponding to a desired magnetic field configuration.

25. The apparatus of claim 16 further comprising a magnetically permeable shield surrounding said coil windings, said shield being of sufficient magnetic permeability to suppress magnetic fields from said coil windings from extending radially outwardly beyond said shield.

26. The apparatus of claim 16 wherein each yoke segment has a radial thickness which is sufficient to effectively shield said chamber from magnetic fields generated by said return filaments.

27. The apparatus of claim 25 wherein:

said shield is of sufficient radial thickness to suppress magnetic fields from said coil windings from extending radially outwardly beyond said shield; and each yoke segment has a radial thickness which is sufficient to effectively shield said chamber from magnetic fields generated by said return filaments.

28. The apparatus of claim 22 wherein N corresponds to one of (a) a magnetic dipole, (b) a magnetic quadrupole, (c) a magnetic sextupole, (d) a magnetic 2N-pole.

29. The apparatus of claim 23 wherein a first one of said superimposed patterns corresponds to a magnetic dipole and a second one of said superimposed patterns corresponds to a magnetic quadrupole.

30. The apparatus of claim 29 wherein said magnetic quadrupole corresponds to a magnetic field shape which tends to compensate for an E×B effect in a plasma near said workpiece.

31. The apparatus of claim 13 wherein said plural current sources are comprised within a multiple current controller which varies said currents over time so as to azimuthally rotate said distribution of currents and thereby rotate said magnetic field.

32. The apparatus of claim 31 wherein said controller is adapted to compute a magnetic field configuration from said distribution of currents and display in image of said magnetic field to a user.

33. The apparatus of claim 32 wherein said controller is further adapted to change said distribution of currents in response to external user inputs.

34. The apparatus of claim 14 further comprising an azimuthal gap in said yoke dividing said yoke into azimuthal segments.

35. The apparatus of claim 12 further comprising plural cooling units between pairs of adjacent ones of said coil windings.

36. A magnetically enhanced plasma reactor for processing a semiconductor workpiece, comprising:

a reactor enclosure defining a vacuum chamber;

a wafer support for holding said workpiece inside said chamber;

a plasma power source for applying plasma source power into said chamber;

a magnetically permeable yoke generally surrounding at least a portion of said chamber;

a first plurality of electrically conductive coil windings distributed about a periphery of said chamber enclosure, each of said coil windings being separately wound around a respective section of said yoke in a direction generally orthogonal to the circumference of said yoke at said respective section;

said plurality of coil windings being capable of permitting different currents through different ones of said coil windings in accordance with a distribution of currents among said coil windings corresponding to a desired magnetic field configuration.

37. The apparatus of claim 36 further comprising:

respective current sources connected to deliver respective currents to different ones of said plurality of coil windings in accordance with said distribution of currents.

38. The apparatus of claim 36 wherein said yoke comprises a plurality of yoke segments around which respective ones of said coil windings are wound.

39. The apparatus of claim 37 wherein said respective current sources apply different currents to different ones of said coil windings in accordance with said distribution of currents among said coil windings corresponding to said desired magnetic field configuration.

40. The apparatus of claim 36 wherein each of said coil windings comprises an interior filament on a radially inward side of the yoke facing said chamber and a exterior return filament on an opposite side of the yoke, and wherein said yoke has sufficient magnetic permeability to effectively shield said chamber from magnetic fields generated by said return filaments.

41. The apparatus of claim 40 wherein said filaments are generally mutually parallel.

42. The apparatus of claim 41 wherein the currents flowing through adjacent ones of said filaments are in the same direction on the interior side of said yoke segments.

43. The apparatus of claim 41 wherein said workpiece piece is generally planar and said filaments extend generally perpendicular with respect to said planar workpiece.

44. The apparatus of claim 40 wherein said filaments are arranged generally in a circle and extend perpendicularly to the plane of said circle.

45. The apparatus of claim 40 wherein:

said filaments are distributed generally in a cylinder about said enclosure and extend axially with respect to said cylinder;

said distribution of currents is in accordance with a periodic pattern around said cylinder.

46. The apparatus of claim 45 wherein said periodic pattern is sinusoidal in $N\theta$, where $\theta$ is an angle of azimuth about said cylinder and $2N$ corresponds to a number of magnetic poles in said desired magnetic field configuration.

47. The apparatus of claim 46 wherein said periodic pattern comprises a superposition of respective patterns sinusoidal in $N\theta$ for respective values of N.

48. The apparatus of claim 36 further comprising:

a second plurality of coil windings distributed about a periphery of said chamber enclosure, each of said second plurality of coil windings extending at least generally in an axial direction relative to said chamber;

said second plurality of coil windings being parallel to and axially displaced from said first plurality of coil windings by a gap providing ingress and egress of said workpiece in said chamber;

said second plurality of coil windings being capable of permitting different currents through different ones of said second plurality of coil windings in accordance with a distribution of currents among said coil windings corresponding to a desired magnetic field configuration.

49. The apparatus of claim 40 further comprising a magnetically permeable shield surrounding said coil windings, said shield being of sufficient magnetic permeability to suppress magnetic fields from said coil windings from extending radially outwardly beyond said shield.

50. The apparatus of claim 40 wherein each yoke segment has a radial thickness which is sufficient to effectively shield said chamber from magnetic fields generated by said return filaments.

51. The apparatus of claim 41 wherein:

said shield is of sufficient radial thickness to suppress magnetic fields from said coil windings from extending radially outwardly beyond said shield; and each yoke segment has a radial thickness which is sufficient to effectively shield said chamber from magnetic fields generated by said return filaments.

52. The apparatus of claim 46 wherein N corresponds to one of (a) a magnetic dipole, (b) a magnetic quadrupole, (c) a magnetic sextupole, (d) a magnetic 2N-pole.

53. The apparatus of claim 47 wherein a first one of said superimposed patterns corresponds to a magnetic dipole and a second one of said superimposed patterns corresponds to a magnetic quadrupole.

54. The apparatus of claim 53 wherein said magnetic quadrupole corresponds to a magnetic field shape which tends to compensate for an E×B effect in a plasma near said workpiece.

55. The apparatus of claim 37 wherein said plural current sources are comprised within a multiple current controller which varies said currents over time so as to azimuthally rotate said distribution of currents and thereby rotate said magnetic field.

56. The apparatus of claim 55 wherein said controller is adapted to compute a magnetic field configuration from said distribution of currents and display in image of said magnetic field to a user.

57. The apparatus of claim 56 wherein said controller is further adapted to change said distribution of currents in response to external user inputs.

58. The apparatus of claim 36 further comprising an azimuthal gap in said yoke dividing said yoke into azimuthal segments.

59. The apparatus of claim 36 further comprising plural cooling units between pairs of adjacent ones of said coil windings.

60. An electromagnet for enhancing plasma etching in a plasma reactor, comprising:

an annular ferromagnetic ring adjacent said reactor and having an axis of symmetry intersecting an interior region of said reactor;

a plurality of electromagnet coils, spaced azimuthally around the ferromagnetic ring, each coil making one or more loops through the ring, primarily in the axial direction on the rings's inner surface, at its azimuthal position; and a current controller independently controlling the current in ones of the electromagnetic coils in a time-dependent fashion.

61. An electromagnet as claimed in 60, wherein the coils are spaced roughly equally in the azimuthal direction around the ferromagnetic ring.

62. An electromagnet as claimed in 61, wherein the number of turns in each of the coils is of the same order of magnitude.

63. An electromagnet as claimed in 60, further comprising:

a second annular ferromagnetic ring encircling the first annular ring and the coils, thereby providing magnetic field containment within the second ring.

64. An electromagnet as claimed in 60, wherein ferromagnetic caps are positioned at or near the axial extremes of the annular ring, thereby providing magnetic field containment.

65. An electromagnet assembly for plasma etching, comprising:

a series of flat or curved ferromagnetic plates, arranged azimuthally, forming a annular yoke, with or without azimuthal gaps between the plates;

a plurality of electromagnet coils, spaced azimuthally around the annular polygon, each coil making one or more loops around a plate, primarily in the axial (vertical) direction on the plate's inner surface, at its azimuthal position; and a current source independently controlling the current in at least some of the electromagnetic coils in a time-dependent fashion.

66. An electromagnet as claimed in claim 65, wherein the coils are spaced roughly equally in the azimuthal direction of the annular ferromagnetic yoke.

67. An electromagnet as claimed in 66, wherein the number of turns in each of the coils is of the same order of magnitude.

68. An electromagnet as claimed in claim 67, wherein an annular ferromagnetic ring or polygon encircles the first annular ferromagnetic polygon and coils, thereby providing magnetic field containment.

69. An electromagnet as claimed in 67, further comprising ferromagnetic caps positioned at or near the axial extremes of the annular ferromagnetic ring or polygon, thereby providing magnetic field containment.

70. A tandem electromagnet assembly for plasma etching, comprising:

an upper annular ferromagnetic ring or a series of flat or curved ferromagnetic plates, arranged azimuthally, forming a annular polygon;

a lower annular ferromagnetic ring or a series of flat or curved ferromagnetic plates, arranged azimuthally, forming a annular polygon;

a plurality of electromagnet coils, spaced azimuthally around the upper ferromagnetic ring or annular polygon of the tandem assembly, each coil making one or more loops around the upper ring or the upper plate, primarily in the axial direction on the ring or plate's inner surface, at its azimuthal position;

a plurality of electromagnet coils, spaced azimuthally around the lower ferromagnetic ring or annular polygon of the tandem assembly, each coil making one or more loops around the lower ring or the lower plate, primarily in the axial direction on the ring or plate's inner surface, at its azimuthal position; and a current controller independently controlling the current in at least some of the electromagnetic coils in a time-dependent fashion.

71. An electromagnet as claimed in claim 70, wherein the coils are spaced roughly equally in the azimuthal direction of both the upper and lower annular ferromagnetic rings or polygons of the tandem-magnet assembly.

72. An electromagnet as claimed in 71, wherein the number of turns in each of the coils is of the same order of magnitude.

73. An electromagnet as claimed in claim 70, further comprising a second pair of annular ferromagnetic rings or polygons encircling the first pair of annular ferromagnetic rings or polygons and coils, thereby providing magnetic field containment.

74. An electromagnet as claimed in claim 70, further comprising ferromagnetic caps positioned at or near the axial extremes of the annular ring or polygon, thereby providing magnetic field containment.

75. An electromagnet for plasma etching, comprising:

a plurality of electromagnet coils, spaced azimuthally around a circle, each coil making one or more loops in an azimuthal plane, with the portion of each loop closest to the plasma etch chamber being primarily in the axial direction; and a current controller independently controlling the current in the electromagnetic coils.

76. An electromagnet as claimed in claim 75, wherein the coils are spaced roughly equally in the azimuthal direction around circle.

77. An electromagnet assembly as claimed in 76, wherein the number of turns in each of the coils is of the same order of magnitude.

78. A tandem electromagnet coil array for plasma etching, comprising:

a plurality of electromagnet coils, spaced azimuthally around a circle, each coil making one or more loops in an azimuthal plane, with the portion of each loop closest to the plasma etch chamber being primarily in the axial (vertical) direction;

a second set of electromagnet coils, spaced azimuthally around a circle, positioned axially in relation to the first set, in a tandem arrangement, each coil making one or more loops in an azimuthal plane, with the portion of each loop closest to the plasma etch chamber being primarily in the axial direction; and a controller independently controlling the current in the electromagnetic coils.

79. An electromagnet as claimed in claim 78, wherein the coils are spaced roughly equally in the azimuthal direction of both the upper and lower circles of the tandem-magnet assembly.

80. An electromagnet assembly as claimed in claim 79, wherein the number of turns in each of the coils is of the same order of magnitude.

81. An electromagnet for plasma etching, comprising:

an annular ferromagnetic ring or polygon;

at least one electromagnet coil, looping through the ferromagnetic ring at an azimuthal position; and a controller controlling the current in the electromagnetic coil.

82. An electromagnet as claimed in claim 81, further comprising a second annular ferromagnetic ring encircling the first annular ring or polygon and coils, thereby providing magnetic field containment.

83. An electromagnet as claimed in claim 81, further comprising ferromagnetic caps positioned at or near the axial extremes of the annular ring or polygon, thereby providing magnetic field containment.

* * * * *